(12) United States Patent
Kumar et al.

(10) Patent No.: US 10,679,848 B2
(45) Date of Patent: Jun. 9, 2020

(54) SELECTIVE ATOMIC LAYER DEPOSITION WITH POST-DOSE TREATMENT

(71) Applicant: Lam Research Corporation, Fremont, CA (US)

(72) Inventors: Purushottam Kumar, Hillsboro, OR (US); Adrien LaVoie, Newberg, OR (US); Ishtak Karim, Portland, OR (US); Jun Qian, Sherwood, OR (US); Frank L. Pasquale, Beaverton, OR (US); Bart J. van Schravendijk, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/034,022

(22) Filed: Jul. 12, 2018

(65) Prior Publication Data
US 2018/0323057 A1    Nov. 8, 2018

Related U.S. Application Data

(62) Division of application No. 15/201,221, filed on Jul. 1, 2016, now Pat. No. 10,062,563.

(51) Int. Cl.
*C23C 16/455* (2006.01)
*C23C 16/04* (2006.01)
(Continued)

(52) U.S. Cl.
CPC ........ *H01L 21/0228* (2013.01); *C23C 16/045* (2013.01); *C23C 16/325* (2013.01);
(Continued)

(58) Field of Classification Search
None
See application file for complete search history.

(56) References Cited

U.S. PATENT DOCUMENTS

| 4,500,563 A | 2/1985 | Ellenberger et al. |
| 5,094,984 A | 3/1992 | Liu et al. |

(Continued)

FOREIGN PATENT DOCUMENTS

| CN | 1732288 A | 2/2006 |
| CN | 1841676 A | 10/2006 |

(Continued)

OTHER PUBLICATIONS

U.S. Office Action dated Mar. 15, 2013 issued in U.S. Appl. No. 13/084,399.
(Continued)

*Primary Examiner* — Zandra V Smith
*Assistant Examiner* — Lawrence C Tynes, Jr.
(74) *Attorney, Agent, or Firm* — Weaver Austin Villeneuve & Sampson LLP

(57) ABSTRACT

Methods and apparatuses for depositing films in high aspect ratio features and trenches using a post-dose treatment operation during atomic layer deposition are provided. Post-dose treatment operations are performed after adsorbing precursors onto the substrate to remove adsorbed precursors at the tops of features prior to converting the adsorbed precursors to a silicon-containing film. Post-dose treatments include exposure to non-oxidizing gas, exposure to non-oxidizing plasma, and exposure to ultraviolet radiation.

13 Claims, 8 Drawing Sheets

(51) Int. Cl.

| | | |
|---|---|---|
| H01L 21/02 | (2006.01) | |
| C23C 16/511 | (2006.01) | |
| C23C 16/40 | (2006.01) | |
| C23C 16/34 | (2006.01) | |
| C23C 16/32 | (2006.01) | |
| C23C 16/52 | (2006.01) | |
| C23C 16/509 | (2006.01) | |
| H01J 37/32 | (2006.01) | |
| C23C 16/505 | (2006.01) | |

(52) U.S. Cl.
CPC .......... *C23C 16/345* (2013.01); *C23C 16/401* (2013.01); *C23C 16/402* (2013.01); *C23C 16/4554* (2013.01); *C23C 16/45542* (2013.01); *C23C 16/45544* (2013.01); *C23C 16/505* (2013.01); *C23C 16/509* (2013.01); *C23C 16/511* (2013.01); *C23C 16/52* (2013.01); *H01J 37/32091* (2013.01); *H01J 37/32192* (2013.01); *H01J 37/32357* (2013.01); *H01J 37/32449* (2013.01); *H01L 21/0217* (2013.01); *H01L 21/02164* (2013.01); *H01L 21/02167* (2013.01); *H01L 21/02274* (2013.01)

(56) References Cited

U.S. PATENT DOCUMENTS

| | | | |
|---|---|---|---|
| 5,223,443 | A | 6/1993 | Chinn et al. |
| 5,230,929 | A | 7/1993 | Caporiccio et al. |
| 5,318,928 | A | 6/1994 | Gegenwart et al. |
| 5,496,608 | A | 3/1996 | Matsuda et al. |
| 5,593,914 | A | 1/1997 | Evans, Jr. et al. |
| 5,670,432 | A | 9/1997 | Tsai |
| 5,856,003 | A | 1/1999 | Chiu |
| 5,874,368 | A | 2/1999 | Laxman et al. |
| 5,916,365 | A | 6/1999 | Sherman |
| 5,932,286 | A | 8/1999 | Beinglass et al. |
| 6,069,058 | A | 5/2000 | Hong |
| 6,100,202 | A | 8/2000 | Lin et al. |
| 6,156,149 | A | 12/2000 | Cheung et al. |
| 6,218,293 | B1 | 4/2001 | Kraus et al. |
| 6,270,572 | B1 | 8/2001 | Kim et al. |
| 6,346,741 | B1 | 2/2002 | Van Buskirk et al. |
| 6,391,803 | B1 | 5/2002 | Kim et al. |
| 6,416,822 | B1 | 7/2002 | Chiang et al. |
| 6,428,859 | B1 | 8/2002 | Chiang et al. |
| 6,468,924 | B2 | 10/2002 | Lee et al. |
| 6,482,726 | B1 | 11/2002 | Aminpur et al. |
| 6,509,601 | B1 | 1/2003 | Lee et al. |
| 6,528,430 | B2 | 3/2003 | Kwan et al. |
| 6,551,893 | B1 | 4/2003 | Zheng et al. |
| 6,569,501 | B2 | 5/2003 | Chiang et al. |
| 6,576,053 | B1 | 6/2003 | Kim et al. |
| 6,602,784 | B2 | 8/2003 | Sneh |
| 6,632,478 | B2 | 10/2003 | Gaillard et al. |
| 6,645,574 | B1 | 11/2003 | Lee et al. |
| 6,689,220 | B1 | 2/2004 | Nguyen |
| 6,723,595 | B2 | 4/2004 | Park |
| 6,730,614 | B1 | 5/2004 | Lim et al. |
| 6,743,738 | B2 | 6/2004 | Todd |
| 6,756,318 | B2 | 6/2004 | Nguyen et al. |
| 6,765,303 | B1 | 7/2004 | Krivokapic et al. |
| 6,809,421 | B1 | 10/2004 | Hayasaka et al. |
| 6,828,218 | B2 | 12/2004 | Kim et al. |
| 6,835,417 | B2 | 12/2004 | Saenger et al. |
| 6,861,356 | B2 | 3/2005 | Matsuse et al. |
| 6,884,466 | B2 | 4/2005 | Kaloyeros et al. |
| 6,930,058 | B2 | 8/2005 | Hill et al. |
| 6,930,060 | B2 | 8/2005 | Chou et al. |
| 6,943,092 | B2 | 9/2005 | Kim et al. |
| 6,962,876 | B2 | 11/2005 | Ahn et al. |
| 6,987,240 | B2 | 1/2006 | Jennings et al. |
| 7,001,844 | B2 | 2/2006 | Chakravarti et al. |
| 7,041,335 | B2 | 5/2006 | Chung |
| 7,077,904 | B2 | 7/2006 | Cho et al. |
| 7,081,271 | B2 | 7/2006 | Chung et al. |
| 7,097,886 | B2 | 8/2006 | Moghadam et al. |
| 7,109,129 | B1 | 9/2006 | Papasouliotis |
| 7,115,166 | B2 | 10/2006 | Vaartstra et al. |
| 7,115,528 | B2 | 10/2006 | Vaartstra et al. |
| 7,122,222 | B2 | 10/2006 | Xiao et al. |
| 7,122,464 | B2 | 10/2006 | Vaarstra |
| 7,125,815 | B2 | 10/2006 | Vaarstra |
| 7,132,353 | B1 | 11/2006 | Xia et al. |
| 7,141,278 | B2 | 11/2006 | Koh et al. |
| 7,148,155 | B1 | 12/2006 | Tarafdar et al. |
| 7,151,039 | B2 | 12/2006 | Lee et al. |
| 7,172,792 | B2 | 2/2007 | Wang et al. |
| 7,176,084 | B2 | 2/2007 | Lee et al. |
| 7,205,187 | B2 | 4/2007 | Leith et al. |
| 7,223,649 | B2 | 5/2007 | Oh et al. |
| 7,235,484 | B2 | 6/2007 | Nguyen et al. |
| 7,241,686 | B2 | 7/2007 | Marcadal et al. |
| 7,244,668 | B2 | 7/2007 | Kim |
| 7,250,083 | B2 | 7/2007 | Sneh |
| 7,259,050 | B2 | 8/2007 | Chen et al. |
| 7,261,919 | B2 | 8/2007 | Mehregany et al. |
| 7,294,582 | B2 | 11/2007 | Haverkort et al. |
| 7,297,641 | B2 | 11/2007 | Todd et al. |
| 7,300,885 | B2 | 11/2007 | Hasebe et al. |
| 7,314,835 | B2 | 1/2008 | Ishizaka et al. |
| 7,341,959 | B2 | 3/2008 | Brcka |
| 7,351,668 | B2 | 4/2008 | Chou et al. |
| 7,361,538 | B2 | 4/2008 | Luan et al. |
| 7,361,611 | B2 | 4/2008 | Chakravarti et al. |
| 7,390,743 | B2 | 6/2008 | Shin |
| 7,393,561 | B2 | 7/2008 | Paranjpe |
| 7,399,388 | B2 | 7/2008 | Moghadam et al. |
| 7,419,888 | B2 | 9/2008 | Yang et al. |
| 7,435,454 | B2 | 10/2008 | Brcka |
| 7,435,684 | B1 | 10/2008 | Lang et al. |
| 7,462,571 | B2 | 12/2008 | Hasebe et al. |
| 7,482,247 | B1 | 1/2009 | Papasouliotis et al. |
| 7,488,694 | B2 | 2/2009 | Kim et al. |
| 7,507,676 | B2 | 3/2009 | Chou et al. |
| 7,510,984 | B2 | 3/2009 | Saito et al. |
| 7,521,331 | B2 | 4/2009 | Park et al. |
| 7,524,762 | B2 | 4/2009 | Marcadal et al. |
| 7,544,615 | B2 | 6/2009 | Vaartstra |
| 7,572,052 | B2 | 8/2009 | Ravi et al. |
| 7,592,231 | B2 | 9/2009 | Cheng et al. |
| 7,595,010 | B2 | 9/2009 | Chakravarti et al. |
| 7,601,648 | B2 | 10/2009 | Chua et al. |
| 7,615,438 | B2 | 11/2009 | Ahn et al. |
| 7,615,449 | B2 | 11/2009 | Chung et al. |
| 7,622,369 | B1 | 11/2009 | Lee et al. |
| 7,622,383 | B2 | 11/2009 | Kim et al. |
| 7,629,267 | B2 | 12/2009 | Wan et al. |
| 7,632,757 | B2 | 12/2009 | Matsuura |
| 7,633,125 | B2 | 12/2009 | Lu et al. |
| 7,638,170 | B2 | 12/2009 | Li |
| 7,645,484 | B2 | 1/2010 | Ishizaka |
| 7,651,729 | B2 | 1/2010 | Kim et al. |
| 7,651,730 | B2 | 1/2010 | Hasebe |
| 7,651,953 | B2 | 1/2010 | Todd et al. |
| 7,651,959 | B2 | 1/2010 | Fukazawa et al. |
| 7,682,657 | B2 | 3/2010 | Sherman |
| 7,687,409 | B2 | 3/2010 | Ahn et al. |
| 7,713,592 | B2 | 5/2010 | Nguyen et al. |
| 7,745,346 | B2 | 6/2010 | Hausmann et al. |
| 7,758,920 | B2 | 7/2010 | Hasebe et al. |
| 7,776,733 | B2 | 8/2010 | Hasegawa |
| 7,790,633 | B1 | 9/2010 | Tarafdar et al. |
| 7,825,039 | B2 | 11/2010 | Takahashi et al. |
| 7,863,190 | B1 | 1/2011 | Papasouliotis et al. |
| 7,906,168 | B2 | 3/2011 | Hasebe et al. |
| 7,919,416 | B2 | 4/2011 | Lee et al. |
| 7,923,068 | B2 | 4/2011 | Dickey et al. |
| 7,923,378 | B2 | 4/2011 | Hasebe et al. |
| 7,959,985 | B2 | 6/2011 | Ishizaka et al. |
| 7,964,241 | B2 | 6/2011 | Hasebe et al. |
| 7,964,513 | B2 | 6/2011 | Todd et al. |
| 7,972,980 | B2 | 7/2011 | Lee et al. |

(56) References Cited

U.S. PATENT DOCUMENTS

| | | | |
|---|---|---|---|
| 7,981,473 B2 | 7/2011 | Kim et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,101,531 B1 | 1/2012 | Li et al. |
| 8,119,424 B2 | 2/2012 | Mather et al. |
| 8,119,544 B2 | 2/2012 | Hasebe et al. |
| 8,133,797 B2 | 3/2012 | van Schravendijk et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,278,224 B1 | 10/2012 | Mui et al. |
| 8,334,218 B2 | 12/2012 | Van Nooten et al. |
| 8,357,619 B2 | 1/2013 | Hasebe et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,524,612 B2 | 9/2013 | Li et al. |
| 8,592,328 B2 | 11/2013 | Hausmann et al. |
| 8,633,050 B2 | 1/2014 | Pierreux |
| 8,637,411 B2 | 1/2014 | Swaminathan et al. |
| 8,647,993 B2 | 2/2014 | Lavoie et al. |
| 8,669,185 B2 | 3/2014 | Onizawa et al. |
| 8,728,955 B2 | 5/2014 | LaVoie et al. |
| 8,728,956 B2 | 5/2014 | LaVoie et al. |
| 8,846,484 B2 | 9/2014 | Lee et al. |
| 8,956,983 B2 | 2/2015 | Swaminathan et al. |
| 8,999,859 B2 | 4/2015 | Swaminathan et al. |
| 9,023,693 B1 | 5/2015 | Lin et al. |
| 9,076,646 B2 | 7/2015 | Sims et al. |
| 9,214,334 B2 | 12/2015 | Swaminathan et al. |
| 9,230,800 B2 | 1/2016 | Lavoie et al. |
| 9,257,274 B2 | 2/2016 | Kang et al. |
| 9,287,113 B2 | 3/2016 | Kang et al. |
| 9,355,839 B2 | 5/2016 | Swaminathan et al. |
| 9,355,886 B2 | 5/2016 | Swaminathan et al. |
| 9,373,500 B2 | 6/2016 | Swaminathan et al. |
| 9,406,693 B1 | 8/2016 | Pang et al. |
| 9,502,238 B2 | 11/2016 | Danek et al. |
| 9,564,312 B2 | 2/2017 | Henri et al. |
| 9,570,274 B2 | 2/2017 | Swaminathan et al. |
| 9,570,290 B2 | 2/2017 | Swaminathan et al. |
| 9,611,544 B2 | 4/2017 | Lavoie et al. |
| 9,673,041 B2 | 6/2017 | Swaminathan et al. |
| 9,685,320 B2 | 6/2017 | Kang et al. |
| 9,773,643 B1 | 9/2017 | Singhal et al. |
| 9,786,570 B2 | 10/2017 | Kang et al. |
| 9,793,110 B2 | 10/2017 | Kang et al. |
| 9,875,891 B2 | 1/2018 | Henri et al. |
| 9,892,917 B2 | 2/2018 | Swaminathan et al. |
| 9,997,357 B2 | 6/2018 | Arghavani et al. |
| 10,008,428 B2 | 6/2018 | Kang et al. |
| 10,037,884 B2 | 7/2018 | Ou et al. |
| 10,043,655 B2 | 8/2018 | Swaminathan et al. |
| 10,043,657 B2 | 8/2018 | Swaminathan et al. |
| 10,062,563 B2 | 8/2018 | Kumar et al. |
| 10,269,559 B2 | 4/2019 | Abel et al. |
| 10,361,076 B2 | 7/2019 | Kang et al. |
| 10,373,806 B2 | 8/2019 | Singhal et al. |
| 10,559,468 B2 | 2/2020 | Arghavani et al. |
| 2002/0066411 A1 | 6/2002 | Chiang et al. |
| 2002/0076507 A1 | 6/2002 | Chiang et al. |
| 2002/0153101 A1 | 10/2002 | Nguyen et al. |
| 2002/0175393 A1 | 11/2002 | Baum et al. |
| 2003/0008070 A1 | 1/2003 | Seutter et al. |
| 2003/0024477 A1 | 2/2003 | Okuda et al. |
| 2003/0143839 A1 | 7/2003 | Raaijmakers et al. |
| 2003/0200917 A1 | 10/2003 | Vaartstra |
| 2003/0216006 A1 | 11/2003 | Li et al. |
| 2004/0033698 A1 | 2/2004 | Lee et al. |
| 2004/0043633 A1 | 3/2004 | Vaartstra |
| 2004/0053515 A1 | 3/2004 | Comita et al. |
| 2004/0121164 A1 | 6/2004 | Iacovangelo et al. |
| 2004/0129212 A1 | 7/2004 | Gadgil et al. |
| 2004/0146644 A1 | 7/2004 | Xiao et al. |
| 2004/0157472 A1 | 8/2004 | Sugino et al. |
| 2004/0171280 A1 | 9/2004 | Conley, Jr. et al. |
| 2004/0219746 A1 | 11/2004 | Vaartstra et al. |
| 2004/0219784 A1 | 11/2004 | Kang et al. |
| 2004/0231799 A1 | 11/2004 | Lee et al. |
| 2005/0005851 A1 | 1/2005 | Keshner et al. |
| 2005/0009368 A1 | 1/2005 | Vaartsra |
| 2005/0042865 A1 | 2/2005 | Cabral et al. |
| 2005/0079661 A1 | 4/2005 | Cho et al. |
| 2005/0100670 A1 | 5/2005 | Dussarrat et al. |
| 2005/0109276 A1 | 5/2005 | Iyer et al. |
| 2005/0118837 A1 | 6/2005 | Todd et al. |
| 2005/0142795 A1 | 6/2005 | Ahn et al. |
| 2005/0158983 A1 | 7/2005 | Hoshi et al. |
| 2005/0159017 A1 | 7/2005 | Kim et al. |
| 2005/0181535 A1 | 8/2005 | Yun et al. |
| 2005/0184397 A1 | 8/2005 | Gates et al. |
| 2005/0196977 A1 | 9/2005 | Saito et al. |
| 2005/0208718 A1 | 9/2005 | Lim et al. |
| 2005/0230047 A1 | 10/2005 | Collins et al. |
| 2005/0233553 A1 | 10/2005 | Kountz et al. |
| 2005/0260347 A1 | 11/2005 | Narwankar et al. |
| 2005/0276099 A1 | 12/2005 | Horng et al. |
| 2005/0282346 A1 | 12/2005 | Barth et al. |
| 2005/0287775 A1 | 12/2005 | Hasebe et al. |
| 2006/0003557 A1 | 1/2006 | Cabral et al. |
| 2006/0009041 A1 | 1/2006 | Iyer et al. |
| 2006/0030148 A1 | 2/2006 | Seutter et al. |
| 2006/0032442 A1 | 2/2006 | Hasebe |
| 2006/0032443 A1 | 2/2006 | Hasebe et al. |
| 2006/0084283 A1 | 4/2006 | Paranjpe et al. |
| 2006/0088985 A1 | 4/2006 | Haverkort et al. |
| 2006/0105106 A1 | 5/2006 | Balseanu et al. |
| 2006/0165890 A1 | 7/2006 | Kaushal et al. |
| 2006/0183055 A1 | 8/2006 | O'Neill et al. |
| 2006/0199357 A1 | 9/2006 | Wan et al. |
| 2006/0216418 A1* | 9/2006 | Matsuura ............... C23C 16/345 427/248.1 |
| 2006/0228868 A1 | 10/2006 | Ahn et al. |
| 2006/0286774 A1 | 12/2006 | Singh et al. |
| 2006/0286776 A1 | 12/2006 | Ranish et al. |
| 2006/0286818 A1 | 12/2006 | Wang et al. |
| 2007/0010071 A1 | 1/2007 | Matsuura |
| 2007/0026540 A1 | 2/2007 | Nooten et al. |
| 2007/0032047 A1 | 2/2007 | Hasebe et al. |
| 2007/0048455 A1 | 3/2007 | Koh et al. |
| 2007/0065576 A1 | 3/2007 | Singh et al. |
| 2007/0087574 A1 | 4/2007 | Gupta et al. |
| 2007/0087581 A1 | 4/2007 | Singh et al. |
| 2007/0116887 A1 | 5/2007 | Faguet |
| 2007/0119370 A1* | 5/2007 | Ma ........................ C23C 16/18 118/723 E |
| 2007/0134942 A1 | 6/2007 | Ahn et al. |
| 2007/0137572 A1 | 6/2007 | Matsuura et al. |
| 2007/0145483 A1 | 6/2007 | Ono |
| 2007/0167028 A1 | 7/2007 | Chou et al. |
| 2007/0215036 A1 | 9/2007 | Park et al. |
| 2007/0218701 A1 | 9/2007 | Shimizu et al. |
| 2007/0231487 A1 | 10/2007 | Ishizaka |
| 2007/0232082 A1 | 10/2007 | Balseanu et al. |
| 2007/0243693 A1 | 10/2007 | Nemani et al. |
| 2007/0251444 A1 | 11/2007 | Gros-Jean et al. |
| 2007/0259110 A1 | 11/2007 | Mahajani et al. |
| 2007/0281495 A1 | 12/2007 | Mallick et al. |
| 2007/0298585 A1 | 12/2007 | Lubomirsky et al. |
| 2008/0014759 A1 | 1/2008 | Chua et al. |
| 2008/0038936 A1 | 2/2008 | Todd et al. |
| 2008/0063791 A1 | 3/2008 | Hasebe et al. |
| 2008/0075881 A1 | 3/2008 | Won et al. |
| 2008/0081470 A1 | 4/2008 | Clark |
| 2008/0085610 A1 | 4/2008 | Wang et al. |
| 2008/0087890 A1 | 4/2008 | Ahn et al. |
| 2008/0123394 A1 | 5/2008 | Lee et al. |
| 2008/0131601 A1 | 6/2008 | Kim et al. |
| 2008/0138996 A1 | 6/2008 | Nishizuka |
| 2008/0139003 A1 | 6/2008 | Pirzada et al. |
| 2008/0207007 A1 | 8/2008 | Thridandam et al. |
| 2008/0213479 A1 | 9/2008 | Chou et al. |
| 2008/0233762 A1 | 9/2008 | Hong |

(56) References Cited

U.S. PATENT DOCUMENTS

| | | |
|---|---|---|
| 2008/0242116 A1 | 10/2008 | Clark |
| 2008/0260969 A1 | 10/2008 | Dussarrat et al. |
| 2008/0274302 A1 | 11/2008 | Hasebe et al. |
| 2008/0311760 A1 | 12/2008 | Nodera et al. |
| 2008/0317972 A1 | 12/2008 | Hendriks et al. |
| 2009/0018668 A1 | 1/2009 | Galbraith |
| 2009/0039349 A1 | 2/2009 | Honda |
| 2009/0041952 A1 | 2/2009 | Yoon et al. |
| 2009/0065896 A1 | 3/2009 | Hwang et al. |
| 2009/0075490 A1 | 3/2009 | Dussarrat |
| 2009/0148625 A1 | 6/2009 | Yeom et al. |
| 2009/0155606 A1 | 6/2009 | Yoon et al. |
| 2009/0155968 A1 | 6/2009 | Min et al. |
| 2009/0163012 A1 | 6/2009 | Clark et al. |
| 2009/0191687 A1 | 7/2009 | Hong et al. |
| 2009/0191722 A1 | 7/2009 | Hasebe et al. |
| 2009/0203197 A1 | 8/2009 | Hanawa et al. |
| 2009/0208880 A1 | 8/2009 | Nemani et al. |
| 2009/0278224 A1 | 11/2009 | Kim et al. |
| 2009/0286381 A1 | 11/2009 | van Schravendijk et al. |
| 2010/0022099 A1 | 1/2010 | Van Nooten et al. |
| 2010/0025824 A1 | 2/2010 | Chen et al. |
| 2010/0048011 A1 | 2/2010 | Yeh et al. |
| 2010/0051578 A1 | 3/2010 | Chang et al. |
| 2010/0051579 A1 | 3/2010 | Kobayashi |
| 2010/0078316 A1 | 4/2010 | Edakawa et al. |
| 2010/0096687 A1 | 4/2010 | Balseanu et al. |
| 2010/0096688 A1 | 4/2010 | Balseanu et al. |
| 2010/0099236 A1 | 4/2010 | Kwon et al. |
| 2010/0099271 A1 | 4/2010 | Hausmann et al. |
| 2010/0102417 A1 | 4/2010 | Ganguli et al. |
| 2010/0120262 A1 | 5/2010 | Vorsa et al. |
| 2010/0124618 A1 | 5/2010 | Kobayashi et al. |
| 2010/0124621 A1 | 5/2010 | Kobayashi et al. |
| 2010/0126667 A1 | 5/2010 | Yin et al. |
| 2010/0136260 A1 | 6/2010 | Matsunaga et al. |
| 2010/0136313 A1 | 6/2010 | Shimizu et al. |
| 2010/0144162 A1 | 6/2010 | Lee et al. |
| 2010/0167555 A1 | 7/2010 | Maula et al. |
| 2010/0190353 A1 | 7/2010 | Nguyen et al. |
| 2010/0197129 A1 | 8/2010 | Ishikawa |
| 2010/0216268 A1 | 8/2010 | Katayama et al. |
| 2010/0221925 A1 | 9/2010 | Lee et al. |
| 2010/0244114 A1 | 9/2010 | Konno et al. |
| 2010/0255218 A1 | 10/2010 | Oka et al. |
| 2010/0304047 A1 | 12/2010 | Yang et al. |
| 2010/0304574 A1 | 12/2010 | Nodera et al. |
| 2010/0310791 A1 | 12/2010 | Shimazu et al. |
| 2011/0003445 A1 | 1/2011 | Murata et al. |
| 2011/0014795 A1 | 1/2011 | Lee et al. |
| 2011/0014796 A1 | 1/2011 | Wallick et al. |
| 2011/0014798 A1 | 1/2011 | Mallick et al. |
| 2011/0042744 A1 | 2/2011 | Cheng et al. |
| 2011/0064969 A1 | 3/2011 | Chen et al. |
| 2011/0086516 A1 | 4/2011 | Lee et al. |
| 2011/0121354 A1 | 5/2011 | Schmid et al. |
| 2011/0124187 A1 | 5/2011 | Afzali-Ardakani et al. |
| 2011/0139176 A1 | 6/2011 | Cheung et al. |
| 2011/0143548 A1 | 6/2011 | Cheung et al. |
| 2011/0151142 A1 | 6/2011 | Seamons et al. |
| 2011/0151246 A1 | 6/2011 | Ramon Moreno et al. |
| 2011/0151674 A1 | 6/2011 | Tang et al. |
| 2011/0151678 A1 | 6/2011 | Ashtiani et al. |
| 2011/0159202 A1 | 6/2011 | Matsushita et al. |
| 2011/0176967 A1 | 7/2011 | Okuda et al. |
| 2011/0198756 A1 | 8/2011 | Thenappan et al. |
| 2011/0201210 A1 | 8/2011 | Sato et al. |
| 2011/0215445 A1 | 9/2011 | Yang et al. |
| 2011/0256726 A1 | 10/2011 | LaVoie et al. |
| 2011/0256734 A1 | 10/2011 | Hausmann et al. |
| 2011/0298099 A1 | 12/2011 | Lee et al. |
| 2011/0309475 A1 | 12/2011 | Lee |
| 2012/0009802 A1 | 1/2012 | LaVoie et al. |
| 2012/0009803 A1 | 1/2012 | Jung et al. |
| 2012/0021252 A1 | 1/2012 | Lee |
| 2012/0028454 A1 | 2/2012 | Swaminathan et al. |
| 2012/0028469 A1 | 2/2012 | Onizawa et al. |
| 2012/0058282 A1 | 3/2012 | Hong et al. |
| 2012/0064682 A1 | 3/2012 | Jang et al. |
| 2012/0074844 A1 | 3/2012 | York et al. |
| 2012/0077349 A1 | 3/2012 | Li et al. |
| 2012/0086048 A1 | 4/2012 | Park et al. |
| 2012/0108079 A1 | 5/2012 | Mahajani |
| 2012/0113672 A1 | 5/2012 | Dubrow et al. |
| 2012/0161405 A1 | 6/2012 | Mohn et al. |
| 2012/0164846 A1 | 6/2012 | Ha et al. |
| 2012/0193693 A1 | 8/2012 | Kanaya |
| 2012/0213940 A1 | 8/2012 | Mallick |
| 2012/0258261 A1 | 10/2012 | Reddy et al. |
| 2012/0280200 A1 | 11/2012 | Tada et al. |
| 2012/0282418 A1 | 11/2012 | Chou et al. |
| 2012/0315394 A1 | 12/2012 | Ito |
| 2013/0040447 A1 | 2/2013 | Swaminathan et al. |
| 2013/0043512 A1 | 2/2013 | Huang et al. |
| 2013/0058161 A1 | 3/2013 | Yamanaka et al. |
| 2013/0058162 A1 | 3/2013 | Yamanaka et al. |
| 2013/0065404 A1 | 3/2013 | Weidman et al. |
| 2013/0071580 A1 | 3/2013 | Weidman et al. |
| 2013/0084688 A1 | 4/2013 | O'Meara et al. |
| 2013/0113073 A1 | 5/2013 | Liu et al. |
| 2013/0115783 A1 | 5/2013 | Kim et al. |
| 2013/0189854 A1 | 7/2013 | Hausmann et al. |
| 2013/0196516 A1 | 8/2013 | Lavoie et al. |
| 2013/0252437 A1 | 9/2013 | Sano et al. |
| 2013/0309415 A1 | 11/2013 | Swaminathan et al. |
| 2013/0319329 A1 | 12/2013 | Li et al. |
| 2013/0323923 A1 | 12/2013 | Koehler et al. |
| 2013/0344248 A1 | 12/2013 | Clark |
| 2014/0030444 A1 | 1/2014 | Swaminathan et al. |
| 2014/0049162 A1 | 2/2014 | Thomas et al. |
| 2014/0051262 A9 | 2/2014 | Lavoie et al. |
| 2014/0087066 A1 | 3/2014 | Wang et al. |
| 2014/0094035 A1 | 4/2014 | Ji et al. |
| 2014/0106574 A1 | 4/2014 | Kang et al. |
| 2014/0113457 A1 | 4/2014 | Sims et al. |
| 2014/0120270 A1 | 5/2014 | Tour et al. |
| 2014/0120737 A1 | 5/2014 | Swaminathan et al. |
| 2014/0134827 A1 | 5/2014 | Swaminathan et al. |
| 2014/0141542 A1 | 5/2014 | Kang et al. |
| 2014/0141626 A1 | 5/2014 | Hausmann et al. |
| 2014/0170853 A1 | 6/2014 | Shamma et al. |
| 2014/0182619 A1 | 7/2014 | Goto et al. |
| 2014/0209562 A1 | 7/2014 | LaVoie et al. |
| 2014/0216337 A1 | 8/2014 | Swaminathan et al. |
| 2014/0239462 A1 | 8/2014 | Shamma et al. |
| 2014/0262038 A1 | 9/2014 | Wang et al. |
| 2014/0264555 A1 | 9/2014 | Ahn et al. |
| 2014/0273428 A1 | 9/2014 | Shero et al. |
| 2014/0273528 A1 | 9/2014 | Niskanen et al. |
| 2014/0295084 A1 | 10/2014 | Shirai et al. |
| 2014/0302686 A1 | 10/2014 | Pan et al. |
| 2015/0041867 A1 | 2/2015 | Han |
| 2015/0048740 A1 | 2/2015 | Valcore, Jr. et al. |
| 2015/0093902 A1 | 4/2015 | Huang et al. |
| 2015/0109814 A1 | 4/2015 | Chen et al. |
| 2015/0126042 A1 | 5/2015 | Pasquale et al. |
| 2015/0147483 A1 | 5/2015 | Fukazawa |
| 2015/0159271 A1 | 6/2015 | Lee et al. |
| 2015/0170900 A1 | 6/2015 | LaVoie |
| 2015/0206719 A1 | 7/2015 | Swaminathan et al. |
| 2015/0235835 A1 | 8/2015 | Swaminathan et al. |
| 2015/0243883 A1 | 8/2015 | Swaminathan et al. |
| 2015/0249013 A1 | 9/2015 | Arghavani et al. |
| 2015/0294905 A1 | 10/2015 | Wu et al. |
| 2016/0020092 A1 | 1/2016 | Kang et al. |
| 2016/0064211 A1 | 3/2016 | Swaminathan et al. |
| 2016/0118246 A1 | 4/2016 | Kang et al. |
| 2016/0148800 A1 | 5/2016 | Henri et al. |
| 2016/0148806 A1* | 5/2016 | Henri .................. H01L 21/0217 438/775 |
| 2016/0155676 A1 | 6/2016 | Kang et al. |
| 2016/0163539 A9 | 6/2016 | Kang et al. |
| 2016/0163972 A1 | 6/2016 | Swaminathan et al. |
| 2016/0240428 A1 | 8/2016 | Tung et al. |

(56) References Cited

U.S. PATENT DOCUMENTS

| | | | |
|---|---|---|---|
| 2016/0251756 A1 | 9/2016 | Lansalot-Matras et al. |
| 2016/0260584 A1 | 9/2016 | Marakhtanov et al. |
| 2016/0293385 A1 | 10/2016 | Kapoor et al. |
| 2016/0293398 A1 | 10/2016 | Danek et al. |
| 2016/0293838 A1 | 10/2016 | Swaminathan et al. |
| 2016/0322215 A1 | 11/2016 | Shaikh |
| 2016/0322371 A1 | 11/2016 | Yonemochi |
| 2016/0329206 A1 | 11/2016 | Kumar et al. |
| 2016/0329423 A1* | 11/2016 | Kawahara ............ H01L 29/063 |
| 2016/0336178 A1 | 11/2016 | Swaminathan et al. |
| 2016/0340782 A1 | 11/2016 | Chandrasekharan et al. |
| 2016/0365425 A1 | 12/2016 | Chen et al. |
| 2016/0379826 A9 | 12/2016 | Arghavani et al. |
| 2017/0009346 A1 | 1/2017 | Kumar et al. |
| 2017/0092735 A1 | 3/2017 | Hashemi et al. |
| 2017/0103891 A1 | 4/2017 | Lee et al. |
| 2017/0110364 A1 | 4/2017 | Song et al. |
| 2017/0110533 A1 | 4/2017 | Huang et al. |
| 2017/0117134 A1 | 4/2017 | Henri et al. |
| 2017/0117150 A1 | 4/2017 | Liao et al. |
| 2017/0140926 A1 | 5/2017 | Pore et al. |
| 2017/0148628 A1 | 5/2017 | Swaminathan et al. |
| 2017/0170026 A1 | 6/2017 | Hudson et al. |
| 2017/0226637 A1 | 8/2017 | Lubomirsky et al. |
| 2017/0263450 A1 | 9/2017 | Swaminathan et al. |
| 2017/0316988 A1 | 11/2017 | Kang et al. |
| 2017/0323786 A1 | 11/2017 | Kang et al. |
| 2018/0005801 A1 | 1/2018 | Singhal et al. |
| 2018/0005814 A1 | 1/2018 | Kumar et al. |
| 2018/0061628 A1 | 3/2018 | Ou et al. |
| 2018/0138028 A1 | 5/2018 | Henri et al. |
| 2018/0247875 A1 | 8/2018 | Kang et al. |
| 2018/0269061 A1 | 9/2018 | Arghavani et al. |
| 2018/0323057 A1 | 11/2018 | Kumar et al. |
| 2019/0080903 A1 | 3/2019 | Abel et al. |
| 2019/0311897 A1 | 10/2019 | Kang et al. |
| 2019/0385820 A1 | 12/2019 | Singhal et al. |
| 2019/0385850 A1 | 12/2019 | Arghavani et al. |

FOREIGN PATENT DOCUMENTS

| | | |
|---|---|---|
| CN | 1926668 A | 3/2007 |
| CN | 101006195 A | 7/2007 |
| CN | 101255548 A | 9/2008 |
| CN | 101328578 A | 12/2008 |
| CN | 101378007 A | 3/2009 |
| CN | 101416293 A | 4/2009 |
| CN | 101535524 A | 9/2009 |
| CN | 101736326 A | 6/2010 |
| CN | 101889331 A | 11/2010 |
| CN | 102005462 A | 4/2011 |
| CN | 102191479 A | 9/2011 |
| CN | 102471885 A | 5/2012 |
| CN | 102687249 A | 9/2012 |
| CN | 102906304 A | 1/2013 |
| CN | 103137864 A | 6/2013 |
| CN | 103928396 A | 7/2014 |
| CN | 105391427 A | 3/2016 |
| CN | 105719954 A | 6/2016 |
| EP | 0 277 766 | 8/1988 |
| EP | 0 541 212 | 5/1993 |
| EP | 1 081 754 A2 | 7/2001 |
| EP | 1 703 552 A2 | 9/2006 |
| EP | 2 278 046 | 1/2011 |
| JP | S48-043472 A | 6/1973 |
| JP | H02-093071 A | 4/1990 |
| JP | H03-011635 | 1/1991 |
| JP | 05-226279 | 9/1993 |
| JP | H06-177120 A | 6/1994 |
| JP | H09-102494 A | 4/1997 |
| JP | H09-219401 A | 8/1997 |
| JP | 10-98032 | 4/1998 |
| JP | H10-189467 A | 7/1998 |
| JP | H11-172439 | 6/1999 |
| JP | 2001-274404 | 10/2001 |
| JP | 2001-338922 A | 12/2001 |
| JP | 2002-009072 | 1/2002 |
| JP | 2002-134497 A | 5/2002 |
| JP | 2002-164345 A | 6/2002 |
| JP | 2002-539640 A | 11/2002 |
| JP | 2005-210076 A | 8/2005 |
| JP | 2005-310927 | 11/2005 |
| JP | 2006-060091 | 3/2006 |
| JP | 2006-303431 A | 11/2006 |
| JP | 2007-165883 | 6/2007 |
| JP | 2007-180362 A | 7/2007 |
| JP | 2007-189173 A | 7/2007 |
| JP | 2007-521658 A | 8/2007 |
| JP | 2007-287889 A | 11/2007 |
| JP | 2007-287890 A | 11/2007 |
| JP | 2008-500742 A | 1/2008 |
| JP | 2008-506262 A | 2/2008 |
| JP | 2008-060455 A | 3/2008 |
| JP | 2008-109093 A | 5/2008 |
| JP | 2008-517479 | 5/2008 |
| JP | 2008-522405 A | 6/2008 |
| JP | 2008-182199 A | 8/2008 |
| JP | 2008-258591 A | 10/2008 |
| JP | 2008-294260 A | 12/2008 |
| JP | 2008-306093 A | 12/2008 |
| JP | 2009-65203 A | 3/2009 |
| JP | 2009-170823 A | 7/2009 |
| JP | 2009-540128 A | 11/2009 |
| JP | 4364320 B2 | 11/2009 |
| JP | 2010-10497 A | 1/2010 |
| JP | 2010-043081 A | 2/2010 |
| JP | 2010-103484 A | 5/2010 |
| JP | 2010-118664 A | 5/2010 |
| JP | 2010-152136 | 7/2010 |
| JP | 2010-183069 A | 8/2010 |
| JP | 2010-530127 | 9/2010 |
| JP | 2010-245518 A | 10/2010 |
| JP | 2010-251654 A | 11/2010 |
| JP | 2010-283388 A | 12/2010 |
| JP | 2010-539730 A | 12/2010 |
| JP | 2011-023576 A | 2/2011 |
| JP | 2011-023655 A | 2/2011 |
| JP | 2011-054968 A | 3/2011 |
| JP | 11-067744 | 4/2011 |
| JP | 2011-187934 A | 9/2011 |
| JP | 2012-506640 A | 3/2012 |
| JP | 2012-199306 | 10/2012 |
| JP | 2013-102130 A | 5/2013 |
| JP | 2013-166965 A | 8/2013 |
| JP | 2013-196822 A | 9/2013 |
| JP | 2013-225655 A | 10/2013 |
| JP | 2013-240042 A | 11/2013 |
| JP | 2014-532304 A | 12/2014 |
| KR | 10-2001-0111448 | 12/2001 |
| KR | 10-0356473 B1 | 10/2002 |
| KR | 10-2004-0001036 | 1/2004 |
| KR | 10-2006-0056883 | 5/2006 |
| KR | 10-0721503 B1 | 5/2007 |
| KR | 10-2007-0060104 | 6/2007 |
| KR | 10-0734748 B | 7/2007 |
| KR | 10-2009-0057665 | 6/2009 |
| KR | 10-2009-0080019 | 7/2009 |
| KR | 10-2009-0081396 | 7/2009 |
| KR | 10-2009-0116433 | 11/2009 |
| KR | 10-2010-0133377 | 12/2010 |
| KR | 10-2011-0086090 | 7/2011 |
| KR | 10-2013-0056608 | 5/2013 |
| KR | 10-2015-0025224 | 3/2015 |
| TW | 483103 B | 4/2002 |
| TW | 200701341 | 1/2007 |
| TW | 2007/21306 | 6/2007 |
| TW | 201009942 A | 3/2010 |
| TW | 201042706 A1 | 12/2010 |
| TW | 2011/13934 A1 | 4/2011 |
| TW | 201140695 A1 | 11/2011 |
| TW | 201144475 A1 | 12/2011 |
| WO | WO 2004/032196 | 4/2004 |
| WO | WO 2006/014471 | 2/2006 |
| WO | WO 2006/018441 | 2/2006 |

(56) References Cited

FOREIGN PATENT DOCUMENTS

| | | |
|---|---|---|
| WO | WO 2006/026350 | 3/2006 |
| WO | WO 2006/104741 | 10/2006 |
| WO | WO 2007/043709 | 4/2007 |
| WO | WO 2007/118026 | 10/2007 |
| WO | WO 2011/087580 | 7/2011 |
| WO | WO 2011/087850 | 7/2011 |
| WO | WO 2011/130326 | 10/2011 |
| WO | WO 2011/130397 | 10/2011 |
| WO | WO 2012/040317 | 3/2012 |
| WO | WO 2012/048094 | 4/2012 |
| WO | WO 2012/087737 | 6/2012 |
| WO | WO 2013/032786 | 3/2013 |
| WO | WO 2013/043330 | 3/2013 |
| WO | WO 2013/065806 | 5/2013 |
| WO | WO 2013/095396 | 6/2013 |
| WO | WO 2013/112727 | 8/2013 |

OTHER PUBLICATIONS

U.S. Final Office Action dated Sep. 13, 2013 issued in U.S. Appl. No. 13/084,399.
U.S. Notice of Allowance dated Jan. 15, 2014 issued in U.S. Appl. No. 13/084,399.
U.S. Office Action dated Jan. 2, 2015 issued in U.S. Appl. No. 14/231,554.
U.S. Final Office Action dated Jun. 10, 2015 issued in U.S. Appl. No. 14/231,554.
U.S. Notice of Allowance dated Aug. 31, 2015 issued in U.S. Appl. No. 14/231,554.
U.S. Office Action dated Sep. 14, 2012 issued in U.S. Appl. No. 13/084,305.
U.S. Final Office Action dated Apr. 25, 2013 issued in U.S. Appl. No. 13/084,305.
U.S. Office Action dated Apr. 13, 2011 issued in U.S. Appl. No. 12/889,132.
U.S. Notice of Allowance dated Sep. 30, 2011 issued in U.S. Appl. No. 12/889,132.
U.S. Office Action dated Aug. 1, 2012 issued in U.S. Appl. No. 13/011,569.
U.S. Final Office Action dated Feb. 26, 2013 issued in U.S. Appl. No. 13/011,569.
U.S. Notice of Allowance dated May 6, 2013 issued in U.S. Appl. No. 13/011,569.
U.S. Office Action dated Jul. 1, 2016 issued in U.S. Appl. No. 13/963,212.
U.S. Office Action dated Jan. 12, 2017 issued in U.S. Appl. No. 13/963,212.
U.S. Final Office Action dated Jun. 28, 2017 issued in U.S. Appl. No. 13/963,212.
U.S. Office Action dated Jan. 24, 2018 issued in U.S. Appl. No. 13/963,212.
U.S. Office Action dated Apr. 4, 2013 issued U.S. Appl. No. 13/242,084.
U.S. Notice of Allowance dated Jun. 19, 2013 issued U.S. Appl. No. 13/242,084.
U.S. Notice of Allowance dated Sep. 19, 2013 issued U.S. Appl. No. 13/242,084.
U.S. Office Action dated Sep. 21, 2015 issued U.S. Appl. No. 14/607,997.
U.S. Final Office Action dated Mar. 18, 2016 issued U.S. Appl. No. 14/607,997.
U.S. Notice of Allowance dated Jun. 16, 2016 issued U.S. Appl. No. 14/607,997.
U.S. Notice of Allowance dated Sep. 27, 2016 issued U.S. Appl. No. 14/607,997.
U.S. Office Action dated Sep. 26, 2017 issued in U.S. Appl. No. 15/426,889.
U.S. Notice of Allowance dated Mar. 28, 2018 issued in U.S. Appl. No. 15/426,889.
U.S. Notice of Allowance dated Aug. 7, 2014 issued U.S. Appl. No. 14/133,239.
U.S. Notice of Allowance dated Nov. 26, 2014 issued U.S. Appl. No. 14/133,239.
U.S. Office Action dated Apr. 29, 2013 issued U.S. Appl. No. 13/224,240.
U.S. Final Office Action dated Nov. 22, 2013 issued U.S. Appl. No. 13/224,240.
US Examiner's Answer to Appeal Brief (filed May 22, 2014) Before the Patent Trial and Appeal Board dated Aug. 14, 2014 issued U.S. Appl. No. 13/224,240.
US Patent Board Decision on Appeal Before the Patent Trial and Appeal Board (Examiner Affirmed) dated Aug. 11, 2016 issued U.S. Appl. No. 13/224,240.
U.S. Notice of Allowance dated Nov. 17, 2016 issued U.S. Appl. No. 13/224,240.
U.S. Notice of Allowance (Supplemental Notice of Allowability) dated Feb. 21, 2017 issued U.S. Appl. No. 13/224,240.
U.S. Office Action dated Jun. 7, 2013 issued U.S. Appl. No. 13/414,619.
U.S. Notice of Allowance dated Jul. 26, 2013, issued U.S. Appl. No. 13/414,619.
U.S. Office Action dated May 24, 2013 issued U.S. Appl. No. 13/472,282.
U.S. Notice of Allowance dated Oct. 4, 2013 issued U.S. Appl. No. 13/472,282.
U.S. Office Action dated May 21, 2014 issued in U.S. Appl. No. 13/607,386.
U.S. Notice of Allowance dated Oct. 8, 2014 issued in U.S. Appl. No. 13/607,386.
U.S. Notice of Allowance dated Nov. 19, 2014 issued in U.S. Appl. No. 13/607,386.
U.S. Office Action dated Jun. 13, 2014 issued in U.S. Appl. No. 13/953,616.
U.S. Final Office Action dated Nov. 24, 2014 issued in U.S. Appl. No. 13/953,616.
U.S. Office Action dated Dec. 11, 2014 issued in U.S. Appl. No. 14/074,596.
U.S. Office Action dated Dec. 24, 2015 issued in U.S. Appl. No. 14/074,596.
U.S. Notice of Allowance dated Feb. 12, 2016 issued in U.S. Appl. No. 14/074,596.
U.S. Office Action dated May 15, 2015 issued in U.S. Appl. No. 14/074,617.
U.S. Notice of Allowance dated Nov. 20, 2015 issued in U.S. Appl. No. 14/074,617.
U.S. Office Action dated Dec. 30, 2016 issued in U.S. Appl. No. 15/015,952.
U.S. Notice of Allowance dated Jun. 15, 2017 issued in U.S. Appl. No. 15/015,952.
U.S. Notice of Allowance dated Jan. 29, 2018 issued in U.S. Appl. No. 15/650,662.
U.S. Office Action dated Aug. 14, 2015 issued in U.S. Appl. No. 14/061,587.
U.S. Notice of Allowance dated Feb. 11, 2016 issued in Application No. 14/061,587.
U.S. Notice of Allowance [Supplemental Notice of Allowability] dated Mar. 1, 2016 issued in U.S. Appl. No. 14/061,587.
U.S. Office Action dated Mar. 2, 2015 issued in U.S. Appl. No. 14/137,860.
U.S. Notice of Allowance dated Oct. 1, 2015 issued in U.S. Appl. No. 14/137,860.
U.S. Notice of Allowance [Supplemental Notice of Allowability] dated Oct. 22, 2015 issued in U.S. Appl. No. 14/137,860.
U.S. Office Action dated Feb. 3, 2017 issued in U.S. Appl. No. 14/987,542.
U.S. Notice of Allowance dated Jun. 20, 2017 issued in U.S. Appl. No. 14/987,542.
U.S. Notice of Allowance dated Aug. 22, 2017 issued in U.S. Appl. No. 14/987,542.
U.S. Office Action dated Nov. 9, 2018 issued in U.S. Appl. No. 15/654,186.

(56) References Cited

OTHER PUBLICATIONS

U.S. Notice of Allowance dated Mar. 7, 2019 issued in U.S. Appl. No. 15/654,186.
U.S. Office Action dated Jul. 10, 2014 issued in U.S. Appl. No. 14/144,107.
U.S. Final Office Action dated Jan. 15, 2015 issued in U.S. Appl. No. 14/144,107.
U.S. Notice of Allowance dated Mar. 19, 2015 issued in U.S. Appl. No. 14/144,107.
U.S. Office Action dated Oct. 21, 2015 issued in U.S. Appl. No. 14/194,549.
U.S. Final Office Action dated Nov. 1, 2016 issued in U.S. Appl. No. 14/194,549.
U.S. Office Action dated Apr. 19, 2017 issued in U.S. Appl. No. 14/194,549.
U.S. Final Office Action dated Sep. 20, 2017 issued in U.S. Appl. No. 14/194,549.
U.S. Notice of Allowance dated Feb. 14, 2018 issued in U.S. Appl. No. 14/194,549.
U.S. Office Action dated Mar. 21, 2019 issued in U.S. Appl. No. 15/976,793.
U.S. Notice of Allowance dated Aug. 5, 2015 issued in U.S. Appl. No. 14/183,287.
U.S. Office Action dated Aug. 1, 2016 issued in U.S. Appl. No. 14/932,869.
U.S. Office Action dated Jul. 2, 2015 issued in U.S. Appl. No. 14/187,145.
U.S. Final Office Action dated Dec. 16, 2015 issued in U.S. Appl. No. 14/187,145.
U.S. Notice of Allowance dated Feb. 25, 2016 issued in U.S. Appl. No. 14/187,145.
U.S. Office Action dated Jun. 9, 2017 issued in U.S. Appl. No. 15/224,347.
U.S. Notice of Allowance dated Oct. 4, 2017 issued in U.S. Appl. No. 15/224,347.
U.S. Notice of Allowance [Corrected Notice of Allowability] dated Nov. 28, 2017 issued in U.S. Appl. No. 15/224,347.
U.S. Office Action dated Jun. 14, 2016 issued in U.S. Appl. No. 15/019,904.
U.S. Notice of Allowance dated Oct. 13, 2016 issued in U.S. Appl. No. 15/019,904.
U.S. Office Action dated Nov. 25, 2016 issued in U.S. Appl. No. 15/178,474.
U.S. Notice of Allowance dated Feb. 10, 2017 issued in U.S. Appl. No. 15/178,474.
U.S. Notice of Allowance dated Mar. 27, 2017 issued in U.S. Appl. No. 15/178,474.
U.S. Notice of Allowance dated Apr. 18, 2017 issued in U.S. Appl. No. 15/178,474.
U.S. Office Action dated Aug. 22, 2017 issued in U.S. Appl. No. 15/609,864.
U.S. Final Office Action dated Dec. 4, 2017 issued in U.S. Appl. No. 15/609,864.
U.S. Notice of Allowance dated Mar. 9, 2018 issued in U.S. Appl. No. 15/609,864.
U.S. Office Action dated Apr. 13, 2015 issued in U.S. Appl. No. 14/335,785.
U.S. Final Office Action dated Aug. 24, 2016 issued in U.S. Appl. No. 14/335,785.
U.S. Notice of Allowance dated Nov. 4, 2016 issued in U.S. Appl. No. 14/335,785.
U.S. Notice of Allowance dated Feb. 22, 2017 issued in U.S. Appl. No. 14/335,785.
U.S. Notice of Allowance dated Mar. 21, 2017 issued in U.S. Appl. No. 14/335,785.
U.S. Notice of Allowance [Corrected Notice of Allowability] dated Apr. 19, 2017 issued in U.S. Appl. No. 14/335,785.
U.S. Office Action dated May 25, 2016 issued in U.S. Appl. No. 14/552,011.
U.S. Notice of Allowance dated Sep. 26, 2016 issued in U.S. Appl. No. 14/552,011.
U.S. Notice of Allowance dated Sep. 28, 2017 issued in U.S. Appl. No. 15/399,637.
U.S. Notice of Allowance dated Jul. 15, 2016 issued in U.S. Appl. No. 14/678,736.
U.S. Office Action dated Aug. 18, 2017 issued in U.S. Appl. No. 15/201,221.
U.S. Notice of Allowance dated Apr. 9, 2018 issued in U.S. Appl. No. 15/201,221.
U.S. Office Action dated Mar. 21, 2019 issued in U.S. Appl. No. 16/034,022.
U.S. Office Action dated Oct. 6, 2017 issued in U.S. Appl. No. 15/253,301.
U.S. Notice of Allowance dated Mar. 26, 2018 issued in U.S. Appl. No. 15/253,301.
U.S. Office Action dated Jan. 26, 2018 issued in U.S. Appl. No. 15/683,397.
U.S. Final Office Action dated Nov. 16, 2018 issued in U.S. Appl. No. 15/683,397.
U.S. Notice of Allowance dated Mar. 28, 2019 issued in U.S. Appl. No. 15/683,397.
U.S. Office Action dated Jul. 18, 2018 issued in U.S. Appl. No. 15/703,917.
U.S. Notice of Allowance dated Dec. 5, 2018 issued in U.S. Appl. No. 15/703,917.
PCT International Search Report and Written Opinion, dated Oct. 20, 2011, issued in Application No. PCT/US2011/032186.
PCT International Preliminary Report on Patentability, dated Oct. 26, 2012, issued in Application No. PCT/US2011/032186.
Korean Office Action, dated Feb. 7, 2017, issued in Application No. KR 10-2012-7004925.
Korean Office Action, dated Aug. 23, 2017, issued in Application No. KR 10-2017-7020548.
Taiwan Office Action dated Apr. 27, 2016 issued in Application No. TW 100113041.
PCT Invitation to Pay Additional Fees; Communication Re Partial International Search, dated Dec. 16, 2011, issued in Application No. PCT/US2011/032303.
PCT International Search Report and Written Opinion, dated Feb. 20, 2012, issued in PCT/US2011/032303.
PCT International Preliminary Report on Patentability and Written Opinion, dated Oct. 26, 2012, issued in PCT/US2011/032303.
PCT International Search Report and Written Opinion dated May 2, 2012 issued in Application No. PCT/US2011/052537.
PCT International Preliminary Report on Patentability and Written Opinion dated Apr. 4, 2013 issued in Application No. PCT/US2011/052537.
Chinese First Office Action dated Jun. 2, 2015 issued in Application No. CN 201180045808.6.
Chinese Second Office Action dated Feb. 2, 2016 issued in Application No. CN 201180045808.6.
Korean Office Action, dated May 23, 2017, issued in Application No. KR 10-2013-7010291.
Korean Office Action, dated Nov. 27, 2017, issued in Application No. KR 10-2013-7010291.
Korean Decision for Grant of Patent, dated Jul. 25, 2018, issued in Application No. KR 10-2013-7010291.
Taiwan Office Action dated May 5, 2016 issued in Application No. TW 100134208.
Taiwan Office Action dated Oct. 19, 2017 issued in Application No. TW 105130207.
PCT International Search Report and Written Opinion dated Dec. 18, 2012, issued in Application No. PCT/US2012/052769.
PCT International Preliminary Report on Patentability and Written Opinion dated Apr. 3, 2014, issued in Application No. PCT/US2012/052769.
Chinese First Office Action dated Nov. 19, 2015 issued in Application No. CN 201280046487.6.
Chinese Second Office Action dated Aug. 22, 2016 issued in Application No. CN 201280046487.6.
Japanese Office Action dated Aug. 23, 2016 issued in Application No. JP 2014-531838.

(56) References Cited

OTHER PUBLICATIONS

Korean First Office Action dated Oct. 2, 2018 issued in Application No. KR 10-2014-7010949.
Singapore Supplementary Examination Report dated Jun. 1, 2016 issued in Application No. SG 11201400633R.
Taiwan Notice of Allowance and Search Report dated Dec. 18, 2015 issued in Application No. TW 101134692.
Taiwan First Office Action dated Mar. 14, 2018 issued in Application No. TW 106122777.
Taiwan Second Office Action dated Dec. 14, 2018 issued in Application No. TW 106122777.
PCT International Search Report and Written Opinion dated Feb. 28, 2013, issued in Application No. PCT/US2012/051740.
PCT International Preliminary Report on Patentability and Written Opinion dated Mar. 13, 2014, issued in Application No. PCT/US2012/051740.
Chinese First Office Action dated Nov. 6, 2015 issued in Application No. CN 201280053888.4.
Chinese Second Office Action dated Aug. 16, 2016 issued in Application No. CN 201280053888.4.
Korean First Office Action dated Oct. 31, 2017 issued in Application No. KR 10-2014-7008696.
Korean Second Office Action dated Sep. 20, 2018 issued in Application No. KR 10-2014-7008696.
Korean Decision for Grant of Patent, dated May 17, 2019 issued in Application No. KR 10-2014-7008696.
Taiwan Office Action and Search Report dated Jan. 27, 2016 issued in Application No. TW 101131556.
Taiwan Office Action and Search Report dated Nov. 9, 2016 issued in Application No. TW 101131556.
Chinese First Office Action dated May 19, 2016 issued in Application No. CN 201310021460.8.
Chinese Second Office Action dated Apr. 13, 2017 issued in Application No. CN 201310021460.8.
Chinese Third Office Action dated Oct. 17, 2017 issued in Application No. CN 201310021460.8.
Chinese Fourt Office Action dated May 16, 2018 issued in Application No. CN 201310021460.8.
European Extended Search Report dated Apr. 14, 2014 issued in Application No. EP 13 15 2046.
European Examination Report dated Dec. 11, 2017 issued in Application No. EP 13 15 2046.
Japanese Office Action dated Jan. 10, 2017 issued in Application No. JP 2013-007612.
Japanese Decision of Rejection dated Jan. 9, 2018 issued in Application No. JP 2013-007612.
Japanese Reason for Refusal dated Apr. 2, 2019 issued in Application No. JP 2013-007612.
Japanese First Office Action dated May 29, 2019 issued in Application No. JP 2018-090402.
Korean Notice of Provisional Rejection dated Dec. 6, 2013 issued in Application No. KR 10-2012-0043797.
Korean Final Office Action dated Aug. 18, 2014 issued in Application No. KR 10-2012-0043797.
Korean Decision from the Patent Tribunal of the KIPO (description) dated May 26, 2015 issued in Application No. KR 10-2012-0043797.
Taiwan Examination Report dated Mar. 29, 2017 issued in Application No. TW 102102054.
PCT International Search Report and Written Opinion dated May 27, 2013, issued in Application No. PCT/US2013/022977.
PCT International Preliminary Report on Patentability and Written Opinion dated Aug. 7, 2014, issued in Application No. PCT/US2013/022977.
Chinese First Office Action dated Feb. 22, 2016 issued in Application No. CN 201380006994.1.
Chinese Second Office Action dated Feb. 6, 2017 issued in Application No. CN 201380006994.1.
Japanese Notification of Reasons for Rejection dated Jan. 10, 2017 issued in Application No. JP2014-554825.
Japanese Decision of Refusal dated Dec. 5, 2017 issued in Application No. JP2014-554825.
Singapore Supplementary Examination Report dated Aug. 11, 2016 issued in Application No. SG 11201404315R.
Taiwan Office Action and Search Report dated Jul. 20, 2016 issued in Application No. TW 102102879.
Taiwan Office Action dated Oct. 25, 2016 issued in Application No. TW 102117772.
Taiwan Rejection Decision dated Aug. 17, 2017 issued in Application No. TW 102117772.
Japanese First Office Action dated Oct. 31, 2017 issued in Application No. JP 2013-230782.
Japanese Second Office Action dated May 22, 2018 issued in Application No. JP 2013-230782.
Japanese Decision to Grant dated Sep. 10, 2018 issued in Application No. JP 2013-230782.
Japanese Office Action dated Dec. 5, 2017 issued in Application No. JP 2013-231188.
Japanese Second Office Action [Decision of Rejection] dated Dec. 4, 2018 issued in Application No. JP 2013-231188.
Taiwan Examination Report dated Jul. 13, 2017 issued in Application No. TW 102140721.
Taiwan First Office Action dated Sep. 20, 2018 issued in Application No. TW 106140906.
Taiwan Examination Report dated Jan. 11, 2017 issued in Application No. TW 102138326.
Chinese First Office Action dated Nov. 28, 2016 issued in Application No. CN 201410521390.7.
Taiwan First Office Action dated May 3, 2018 issued in Application No. TW 103133765.
Japanese First Office Action dated Dec. 18, 2018 issued in Application No. JP 2014-262248.
Singapore Eligibility to Grant w/Supplemental Examinatinon Report dated Apr. 23, 2019 issued in Application No. SG 10201408801Q.
Taiwan First Office Action dated Jun. 26, 2018 issued in Application No. TW 103145386.
Chinese First Office Action dated May 27, 2017 issued in Application No. CN 201510091775.9.
Chinese Second Office Action dated Mar. 26, 2018 issued in Application No. CN 201510091775.9.
Chinese Third Office Action dated Oct. 15, 2018 issued in Application No. CN 201510091775.9.
Chinese Fourth Office Action dated Mar. 27, 2019 issued in Application No. CN 201510091775.9.
Taiwanese First Office Action dated Sep. 14, 2018 issued in Application No. TW 104106165.
Chinese First Office Action dated Apr. 11, 2016 issued in Application No. CN 201510086588.1.
Chinese Second Office Action dated Mar. 20, 2017 issued in Application No. CN 201510086588.1.
Japanese Office Action dated Apr. 19, 2016 issued in Application No. JP 2015-21804.
Korean First Office Action dated Feb. 19, 2016, issued in Application No. KR 10-2015-0022610.
Korean Final Office Action dated Jun. 29, 2016, issued in Application No. KR 10-2015-0022610.
Taiwan Notice of Allowance and Search Report dated Aug. 30, 2018 issued in Application No. TW 104104471.
Singapore Search Report and Written Opinion dated Mar. 14, 2019 issued in Application No. SG 10201807090Q.
Taiwan First Office Action dated Sep. 13, 2018, issued in Application No. TW 104104648.
Chinese Third Office Action dated Dec. 22, 2017, issued in Application No. CN 201380006994.1.
Taiwanese First Office Action dated Nov. 9, 2018 issued in Application No. TW 104122669.
Chinese First Office Action dated Mar. 30, 2018 issued in Application No. CN 201610206201.6.
Chinese Second Office Action dated Jan. 24, 2019 issued in Application No. CN 201610206201.6.
Chinese First Office Action dated Oct. 8, 2018 issued in Application No. CN 201710522311.8.

(56) References Cited

OTHER PUBLICATIONS

PCT International Search Report and Written Opinion dated Feb. 25, 2019 issued in Application No. PCT/US2018/050049.
Cecchi et al., (2007) "Ultra-thin conformal pore-sealing of low-k materials by plasma-assisted ALD," *University of New Mexico, Albuquerque, NM, Sandia National Labs, Albuquerque, NM*, 1 page.
Choi, Gyu-Jin et al., (2009) "Plasma-enhanced atomic layer deposition of $TiO_2$ and Al-doped $TiO_2$ films using $N_2O$ and $O_2$ reactants," *Journal of the Electrochemical Society*, 156(9):G138-G143.
Faraz et al., (2015) "Atomic Layer Etching. What Can We Learn from Atomic Layer Deposition?," *ECS Journal of Solid State Science and Technology*, 4(6):N5023-N5032.
Hausmann et al., (2002) "Atomic Layer Deposition of Hafnium and Zirconium Oxides Using Metal Amide Precursors," *Chem. Mater.* 14(10):4350-4358.
Elam et al., (2003) "Growth of ZnO/Al2O3 Alloy Films Using Atomic Layer Deposition Techniques," Chemistry of Materials, 2003, vol. 15, No. 4, pp. 1020-1028. <doi:10.1021/cm020607+>.
Kim, H., et al., (2002) "The Growth of Tantalum Thin Films by Plasma-Enhanced Atomic Layer Deposition and Diffusion Barrier Properties," *Mat. Res. Soc. Symp. Proc.* 716:B8.5.1-B8.5.6.
King, Sean W., (Jul./Aug. 2011) "Plasma enhanced atomic layer deposition of $SiN_x$:H and $SiO_2$," *J. Vac. Sci. Technol.* A29(4):041501-1 through 041501-9 (9 pages).
Ko, Myoung-Gyun, et al., "Characterization of ruthenium thin film deposited by rf-direct plasma atomic layer deposition," *209th ECS Meeting*, Abstract #50, p. 1 [Downloaded on Jun. 9, 2014].
Ko, Myoung-Gyun, et al., (Oct. 2008) "Correlation of Carbon Content with the Thermal Stability of Ruthenium Deposited by Using RF-Direct Plasma-Enhanced Atomic-Layer Deposition," *Journal of the Korean Physical Society*, 53(4):2123-2128.
Lavareda et al., (2004) "Properties of a-Si:H TFTs using silicon carbonitride as dielectric," *Journal of Non-Crystalline Solids*, 338-340:797-801.
Lee et al., (2005) "Chemically conformal deposition of $SrTiO_3$ thin films by Atomic Layer Deposition using conventional metal organic precursors and remote-plasma activated $H_2O$," School of Materials Science and Engineering, and Inter-university Semiconductor Research Center, Seoul National University, *Microelectronic Engineering* 80:158-161.
Lee, Jong Ju, (2005) "Low-impurity, highly conformal atomic layer deposition of titanium nitride using $NH_3$—Ar—$H_2$ plasma treatment for capacitor electrodes," *Materials Letters*, 59:615-617.
Li, Xingcun, et al., (2011) "Atomic Layer Deposition $Al_2O_3$ Thin Films in Magnetized Radio Frequency Plasma Source," *Physics Procedia* 18:100-106.
Man P.F. et al., (Feb. 11-15, 1996) "Elimination of Post-Release Adhesion in Microstructures Using Conformal Fluorocarbon Coatings," *MEMS '96 Proceedings, IEEE*, pp. 55-60.
Nguyen, S.V. et al., (Jan./Mar. 1999) "Plasma-assist chemical vapor deposition of dielectric thin films for ULSI semiconductor circuits," *IBM J.Res.Develop.* 43(1.2):5-38.
Plasma Enhanced Atomic Layer Deposition (PEALD), Website: http://www.asm.com/index.php?option=com_content&task=view&id=19&Itemid=161 (2010), 1 page.
"PlasmaPro™ NGP® 80 Range," *Oxford Instruments* (2010), 8 pages.
Pritchett, Merry, (May 2004) "Adherence/Diffusion Barrier Layers for Copper Metallization: Amorphous Carbon: Silicon Polymerized Films," Dissertation Prepared for the Degree of Doctor of Philosophy, *University of Texas*, 113pp.
Puurunen, Riikka L. (2005) "Surface chemistry of atomic layer deposition: A case study for the trimethylaluminum/water process," *Journal of Applied Physics*, 97:121301-1-121301-52.
Van der Straten et al., (2004) "Atomic layer deposition of tantalum nitride for ultrathin liner applications in advanced copper metallization schemes," *Journal of Materials Research*, 19(2):447-453.
U.S. Appl. No. 16/036,784, filed Jul. 16, 2018, Ou et al.
U.S. Office Action dated Oct. 1, 2019 issued in U.S. Appl. No. 15/965,628.
U.S. Notice of Allowance dated Oct. 3, 2019 issued in U.S. Appl. No. 15/976,793.
U.S. Office Action dated Jul. 30, 2019 issued in U.S. Appl. No. 15/847,744.
Korean First Office Action dated Aug. 19, 2019 issued in Application No. KR 10-2019-7012231.
Japanese Notice of Reason for Refusal dated Jul. 24, 2018 issued in Application No. JP 2017-159931.
Japanese Second Office Action dated Jun. 17, 2019 issued in Application No. JP 2017-159931.
Korean First Office Action dated Jun. 28, 2019 issued in Application No. KR 10-2013-0056776.
Taiwan First Office Action dated Oct. 16, 2019 issued in Application No. TW 105109955.
Chinese Second Office Action dated Jun. 13, 2019 issued in Application No. CN 201710522311.8.
Japanese Second Office Action [Decision of Rejection] dated Jan. 14, 2020 issued in Application No. JP 2018-090402.
U.S. Final Office Action dated Jan. 21, 2020 issued in U.S. Appl. No. 15/847,744.
Chinese First Office Action dated Jan. 20, 2020 issued in Application No. CN 201710347032.2.

\* cited by examiner

SELECTIVE ATOMIC LAYER DEPOSITION WITH POST-DOSE TREATMENT

CROSS-REFERENCE TO RELATED APPLICATIONS

This application is a divisional application of U.S. patent application Ser. No. 15/201,221, titled "SELECTIVE ATOMIC LAYER DEPOSITION WITH POST-DOSE TREATMENT" and filed on Jul. 1, 2016, and which is hereby incorporated by reference in its entirety and for all purposes.

BACKGROUND

Fabrication of devices such as semiconductor devices may involve deposition of various dielectric, conductive, or semiconductive films in or over raised or recessed features on a substrate. Deposition of films that are conformal to the underlying topography of a substrate can be challenging, particularly as aspect ratios increase and critical dimensions of features decrease with fabrication of increasingly smaller devices.

SUMMARY

Provided herein are methods of processing substrates. One aspect involves a method of processing a patterned substrate in a process chamber, the method including: (a) providing the patterned substrate having one or more features; (b) exposing the patterned substrate to a silicon-containing precursor under conditions allowing the silicon-containing precursor to adsorb onto surfaces of the one or more features, thereby forming an adsorbed layer of the silicon-containing precursor over the patterned substrate; (c) before exposing the patterned substrate to a reactant to form a silicon-containing film and after exposing the patterned substrate to the silicon-containing precursor, performing a post-dose treatment operation to preferentially remove the adsorbed layer at tops of the one or more features; and (d) exposing the patterned substrate to the reactant and igniting a first plasma to form the silicon-containing film over the patterned substrate.

In some embodiments, performing the post-dose treatment operation includes exposing the patterned substrate to a gas such as any of nitrogen, argon, hydrogen, ammonia, helium, and $C_xH_y$, where x is an integer between and including 1-5 and y is an integer between and including 4-16. In various embodiments, performing the post-dose treatment operation further includes igniting a second plasma at a plasma power less than about 6 kW. In some embodiments, performing the post-dose treatment operation further includes applying a bias at a bias power between 0 W and 1000 W.

In various embodiments, performing the post-dose treatment operation includes exposing the patterned substrate to ultraviolet radiation at a wavelength between about 10 nm and about 400 nm.

In some embodiments, the post-dose treatment operation is performed for a duration between about 0.1 seconds and about 10 seconds.

In various embodiments, the patterned substrate is processed on a pedestal, and the silicon-containing film is deposited and the post-dose treatment operation is performed at a pedestal temperature between about 25° C. and about 650° C.

In some embodiments, the silicon-containing film is any of silicon oxide, silicon nitride, and silicon carbide.

In various embodiments, the thickness of the silicon-containing film at the tops of the one or more features is less than the thickness of the silicon-containing film at bottoms of the one or more features. In some embodiments, the one or more features have an aspect ratio of at least about 2:1. In various embodiments, at least one of the one or more features has a feature opening is less than about 5000 nm wide. In some embodiments, the method also includes repeating (a)-(d) for n cycles, where n is an integer greater than 2. In some embodiments, the process chamber is purged between performing operations (b) and (c). In various embodiments, the process chamber is purged between performing operations (c) and (d).

Another aspect involves a method of processing a patterned substrate, the method including: (a) providing a patterned substrate having one or more features; (b) exposing the substrate to a silicon-containing precursor under conditions allowing the silicon-containing precursor to adsorb onto surfaces of the one or more features, thereby forming an adsorbed layer of the silicon-containing precursor over the patterned substrate; (c) before exposing the patterned substrate to a reactant to form a silicon oxide film and after exposing the patterned substrate to the silicon-containing precursor, performing a post-dose treatment operation to preferentially remove the adsorbed layer at tops of the one or more features, and (d) exposing the patterned substrate to an oxygen-containing reactant and igniting a first plasma to form the silicon oxide film over the patterned substrate.

In various embodiments, performing the post-dose treatment operation includes exposing the patterned substrate to a non-oxidizing gas such as any of nitrogen, argon, hydrogen, ammonia, helium, and $C_xH_y$, where x is an integer between and including 1-5 and y is an integer between and including 4-16. In some embodiments, performing the post-dose treatment operation further includes igniting a second plasma at a plasma power less than about 6 kW.

In various embodiments, performing the post-dose treatment operation includes exposing the patterned substrate to ultraviolet radiation at a wavelength between about 10 nm and about 400 nm.

Another aspect involves an apparatus for processing substrates, the apparatus including: (a) at least one process chamber including a pedestal for holding a substrate having one or more features; (b) at least one outlet for coupling the at least one process chamber to a vacuum; (c) one or more process gas inlets coupled to one or more silicon-containing precursor sources, one or more post-dose treatment gas sources, and one or more reactant gas sources; (d) a radio frequency (RF) generator; and (e) a controller for controlling operations in the apparatus, including machine-readable instructions for: (i) introducing a silicon-containing precursor from at least one of the one of the one or more silicon-containing precursor sources to the at least one process chamber under conditions allowing the silicon-containing precursor to adsorb onto the surface of the substrate, thereby forming an adsorbed layer of the silicon-containing precursor over the substrate; (ii) prior to introducing a reactant from at least one of the one or more reactant gas sources to the at least one process chamber and after introducing the silicon-containing precursor, performing a post-dose treatment operation to remove adsorbed silicon-containing precursor at tops of the one or more features of the substrate, and (iii) introducing the reactant and igniting a plasma to form a silicon-containing film over the substrate.

These and other aspects are described further below with reference to the drawings.

DETAILED DESCRIPTION

Figure 1B:
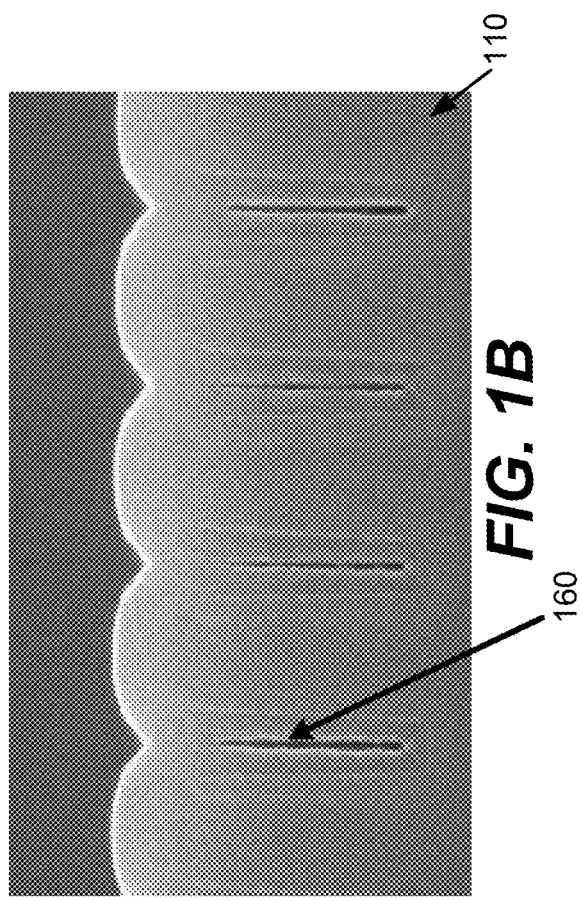
FIG. 1B is an image of features in a substrate.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

The implementations disclosed below describe methods for depositing a material on a substrate such as a wafer, substrate, or other work piece. The work piece may be of various shapes, sizes, and materials. In addition to semiconductor wafers, other work pieces that may be used implementations disclosed herein include various articles such as printed circuit boards and the like. The processes and apparatuses can be used in the fabrication of semiconductor devices, displays, LEDs, photovoltaic panels and the like.

Manufacturing processes of semiconductor devices typically involve depositing one or more conformal thin films on a substrate in an integrated fabrication process. For example, some front-end-of-the-line processes may involve deposition of conformal films by atomic layer deposition (ALD). ALD is a technique that deposits thin layers of material using sequential self-limiting reactions. ALD processes use surface-mediated deposition reactions to deposit films on a layer-by-layer basis in cycles. As an example, an ALD cycle may include the following operations: (i) delivery/adsorption of a precursor, (ii) purging of precursor from the chamber, (iii) delivery of a second reactant and optionally ignite plasma, and (iv) purging of byproducts from the chamber. The reaction between the second reactant and the adsorbed precursor to form a film on the surface of a substrate affects the film composition and properties, such as nonuniformity, stress, wet etch rate, dry etch rate, electrical properties (e.g., breakdown voltage and leakage current), etc. In ALD deposition of silicon oxide films, this reaction involves reacting oxygen plasma with carbon and nitrogen to form a gaseous species; oxidizing silicon to silicon oxide; eliminating trace carbon, nitrogen, and hydrogen impurities; and increasing bonding and densification of the film.

Unlike a chemical vapor deposition (CVD) technique, ALD processes use surface-mediated deposition reactions to deposit films on a layer-by-layer basis. In one example of an ALD process, a substrate surface that includes a population of surface active sites is exposed to a gas phase distribution of a first precursor, such as a silicon-containing precursor, in a dose provided to a chamber housing the substrate. Molecules of this first precursor are adsorbed onto the substrate surface, including chemisorbed species and/or physisorbed molecules of the first precursor. It should be understood that when the compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the chamber is then evacuated to remove most or all of the first precursor remaining in gas phase so that mostly or only the adsorbed species remain. In some implementations, the chamber may not be fully evacuated. For example, the reactor may be evacuated such that the partial pressure of the first precursor in gas phase is sufficiently low to mitigate a reaction. A second reactant, such as an oxygen-containing reactant, is introduced to the chamber so that at least some of these molecules react with the first precursor adsorbed on the surface. In some processes, the second precursor reacts immediately with the adsorbed first precursor. In other embodiments, the second reactant reacts only after a source of activation is applied temporally. For example, the second reactant may be ignited with the plasma. The chamber may then be evacuated again to remove unbound and/or unreacted second reactant molecules. As described above, in some embodiments the chamber may not be completely evacuated. Additional ALD cycles may be used to build film thickness.

In typical ALD processes, the ALD first precursor dose at least partially saturates the substrate surface. In some embodiments, the dose phase of an ALD cycle concludes before the precursor contacts the substrate to evenly saturate the surface. Typically, the precursor flow is turned off or diverted at this point, and only purge gas flows. By operating in this sub-saturation regime, the ALD process reduces the cycle time and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587, filed Oct. 23, 2013, titled "SUB-SATURATED ATOMIC LAYER DEPOSITION AND CONFORMAL FILM DEPOSITION," which is incorporated herein by reference in its entirety.

In some implementations, the ALD methods include plasma activation. As described herein, the ALD methods and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in their entireties.

ALD processes may be used for blanket or patterned substrates. Substrates may include "features" or "trenches." Features may be characterized by one or more of narrow and/or re-entrant openings, constrictions within the feature, and high aspect ratios. The feature may be formed in one or more of the above described layers. One example of a feature is a hole or via in a semiconductor substrate or a layer on the substrate. Another example is a trench in a substrate or layer. The terms "trench" and "feature" may be used interchangeably in the present disclosure and will be understood to include any hole, via, or recessed region of a substrate. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

Films deposited by ALD are typically conformal. Conformality of films may be measured by the step coverage. Step coverage may be calculated by comparing the average thickness of a deposited film on a bottom, sidewall, or top of a feature or trench to the average thickness of a deposited film on a bottom, sidewall, or top of a feature or trench. For example, step coverage may be calculated by dividing the average thickness of the deposited film on the sidewall by the average thickness of the deposited film at the top of the feature and multiplying it by 100 to obtain a percentage. Although ALD can deposit highly conformal films, deposition of films into high aspect ratio features becomes challenging. The step coverage and uniformity of film property along the side wall depends on, among many factors, the transport of the deposition precursor, reactant ions and/or radicals, and by-products. As the dimension of the feature or trench is reduced, transport and diffusion of the deposition precursor and reactant becomes increasing difficult in the feature, thereby leading to formation of a seam and/or voids in high aspect ratio features.

Figure 1A:
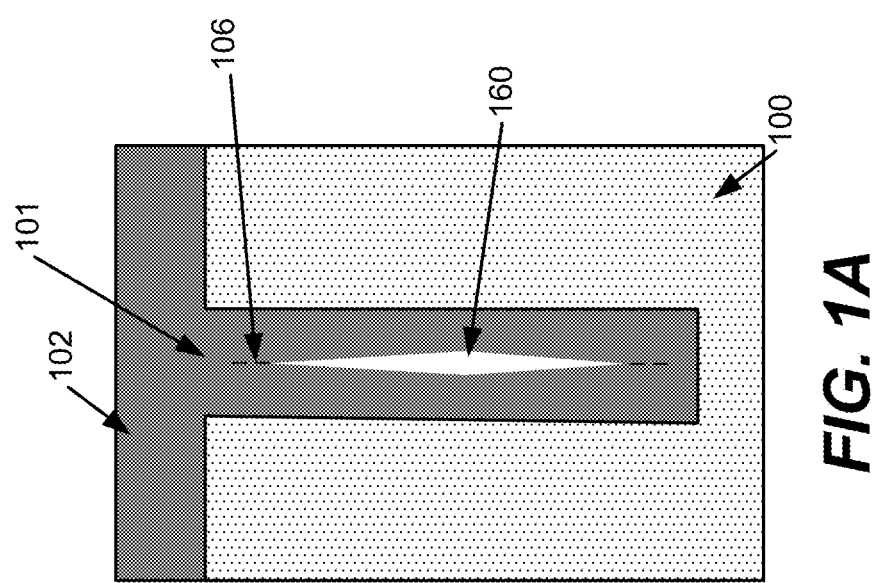
FIG. 1A is a schematic illustration of a feature in a substrate.

In plasma-enhanced ALD (PEALD) processes, the top of the trenches to precursor and reactant species is exposed to more precursor and reactant species, while surfaces deeper into a feature are exposed to fewer precursor and reactant species due to the diffusion of the precursor and reactant species. This differential in molecular interactions at the top, sidewall, and bottom of the feature leads to non-uniform properties along the sidewall of the feature. For example, in high aspect ratio features, as described above, a void and/or a seam may form in the middle of the feature. FIG. 1A shows an example of a substrate 100 having feature or trench 101 which is filled with silicon oxide 102 by a conventional PEALD technique. A seam 106 forms where the silicon oxide growth from the sidewalls of the feature 101 meet, and an air-gap or void 160 forms in the center of the feature 101, thereby resulting in incomplete fill of the feature 101. As various PEALD deposition cycles are performed, the opening at the top of feature 101 closes and molecular transport becomes progressively difficult, leading to progressive degradation of the film and closing at the top of the feature 101, leaving a void 160 in the feature 101. FIG. 1B shows an image of a substrate 110 after exposure to hydrofluoric acid (HF) used to etch the substrate 110, which causes void 160 to be visible after the etching process.

In addition to the formation of voids and seams, the film deposited within the trench may have a different and more degraded film quality than the film deposited near the top of a trench. This may be because the second reactant species is unable to transport into the depths of the trench and the number and distribution of reactant species reaching the trench bottom is different from and less than at the top. The film quality can be evaluated by etching the deposited film in diluted HF and observing and comparing the amount of film etched at or near the top of the trenches and the amount of film etched along the sidewalls. Films having a high wet etch rate are more easily etched using HF.

Figure 2A:
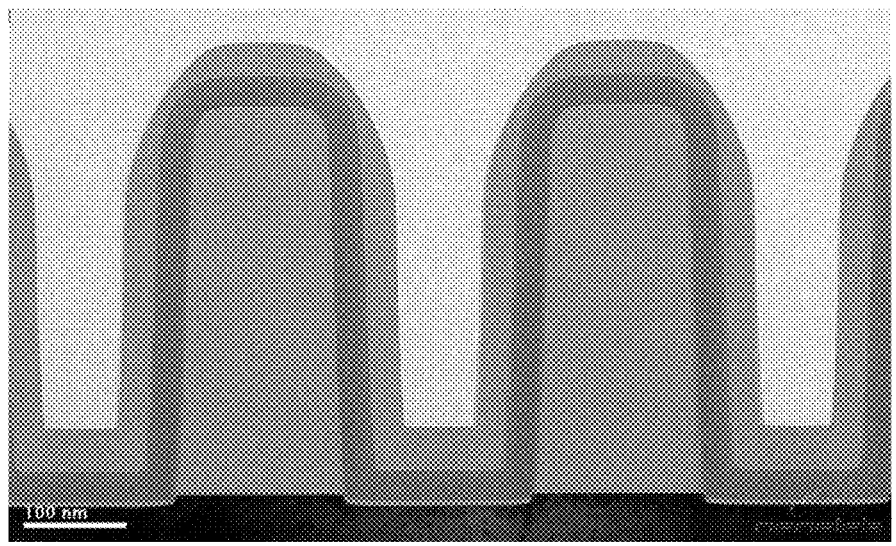
FIGS. 2A and 2B are images of trenches in substrates.
Figure 2B:
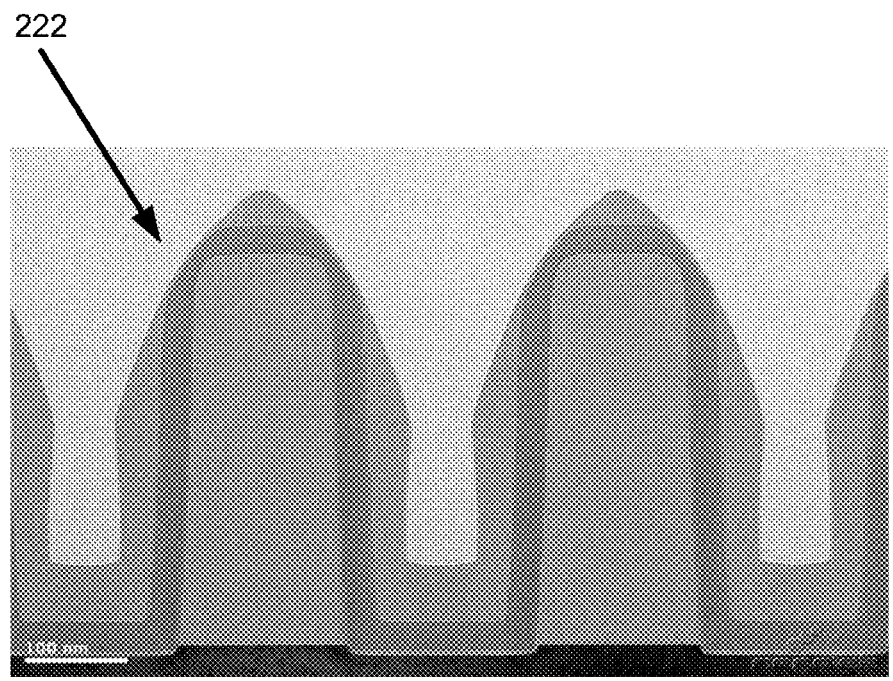

Conventional techniques for increasing exposure time to the second reactant and plasma to allow more reactant species to diffuse into trenches have drawbacks. For example, increasing plasma exposure time or plasma power may lead to densification and/or sputtering at the top of the features and along corners at or near the top of the features. An example is provided in FIGS. 2A and 2B. FIG. 2A shows a substrate with a film deposited using exposures to cycles of a precursor and 2-second exposures to a second reactant ignited with plasma at 495° C. FIG. 2B shows a substrate with a film deposited using exposures to cycles of a precursor and 5-second exposures to a second reactant ignited with plasma at 495° C. As shown, the substrate in FIG. 2B has been sputtered at the trench edges 222, resulting in a non-conformal film.

Provided herein are methods and apparatuses for forming films using ALD and or PEALD and post-dose treatments during ALD and/or PEALD cycles. Disclosed embodiments may be used to partially fill high aspect ratio structures, such as for forming contact liners, and may also be used to completely fill high aspect ratio structures, such as for gapfill applications. Disclosed embodiments may be suitable for depositing silicon-containing material into high aspect ratio features, such as silicon oxide, silicon, poly-silicon, and silicon nitride. Methods may be used for filling through so it can be us and for 3D NAND applications. Disclosed embodiments reduce deposition at or near the top of features or trenches by removing adsorbed precursor from a precursor exposure dose at the top of the features while leaving most of the sidewalls and the bottom of the features saturated with adsorbed precursor prior to exposing the substrate to a second reactant and igniting a plasma to form a film conformal along most of the sidewalls and at the bottom of features while forming a partial or no film at the top of the features. In some embodiments, exposures to an adsorbed precursor layer on a substrate to a post-dose treatment may be used in the initial ALD or PEALD cycles to allow bottom-up fill of features and trenches and prevent the opening at the top of the features and trenches from closing prior to filling the feature or trench.

Figure 3:
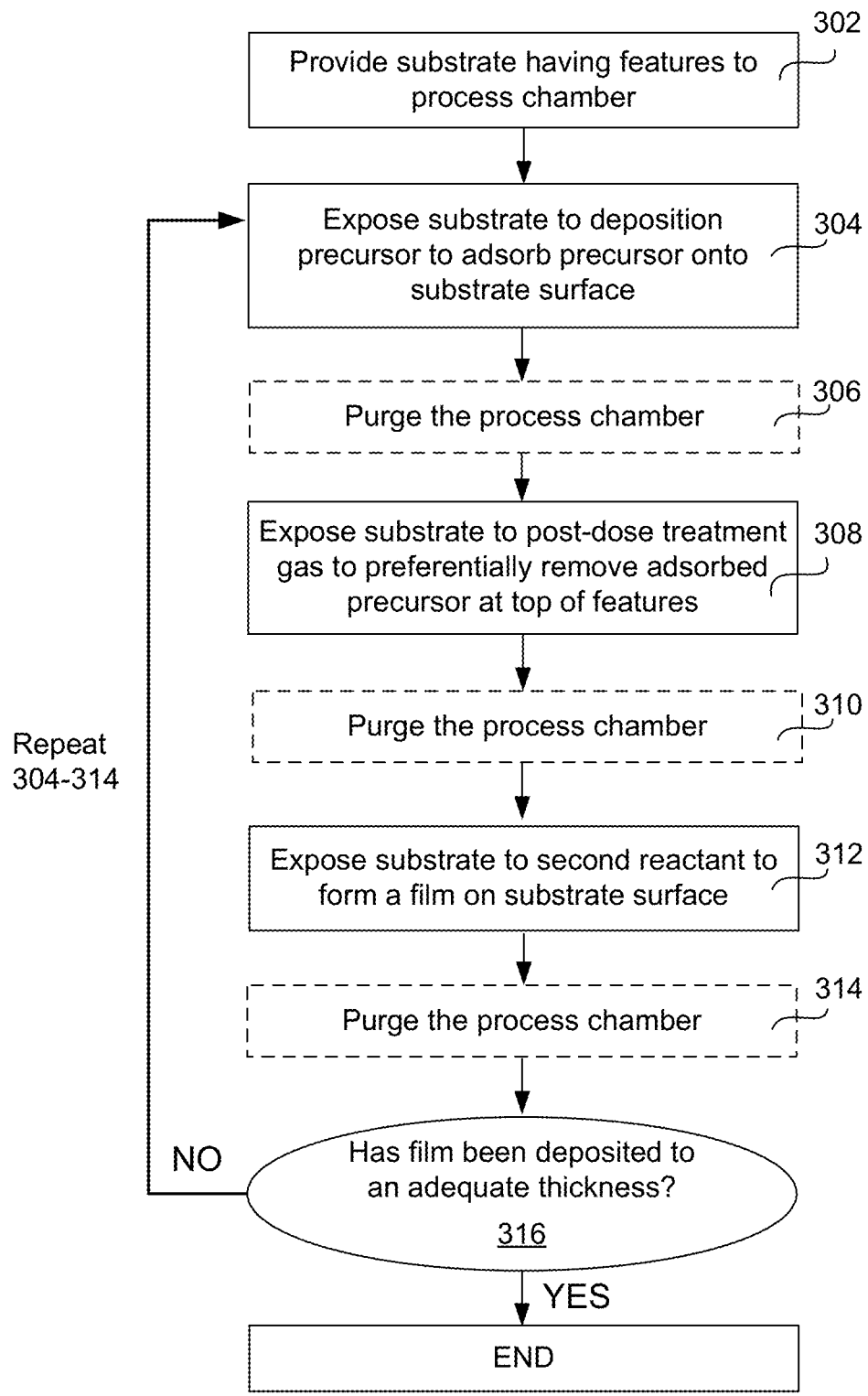
FIG. 3 is a process flow diagram depicting operations for a method in accordance with certain disclosed embodiments.

FIG. 3 is a process flow diagram depicting operations for a method performed in accordance with certain disclosed embodiments. Although examples provided herein describe disclosed embodiments in the context of depositing silicon oxide films, it should be understood that disclosed embodiments may also be used to deposit films of any material.

Figure 4A:
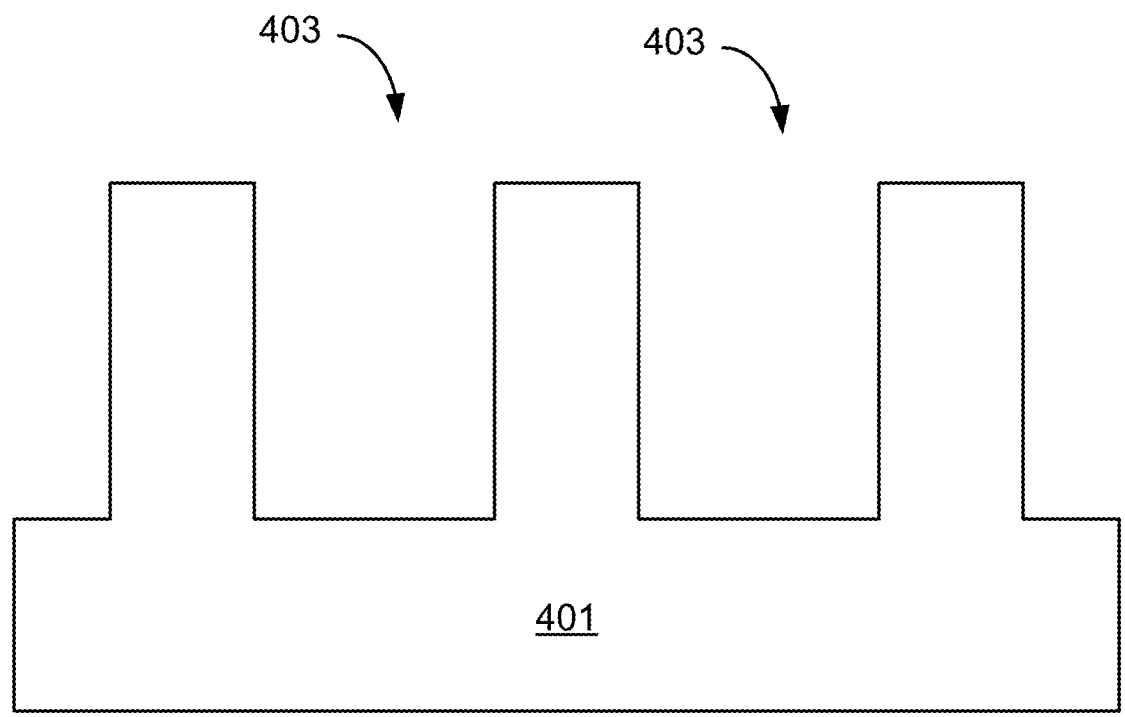
FIGS. 4A-4D are schematic illustrations of substrates during operations performed in accordance with certain disclosed embodiments.

In operation 302 of FIG. 3, a substrate is provided to a process station or chamber of a single station or multi-station chamber. Suitable apparatuses for performing certain disclosed embodiments are further described below. In various embodiments, the substrate is a semiconductor substrate. The substrate may be a silicon wafer, e.g., a 200-mm wafer, a 300-mm wafer, or a 450-mm wafer, such as wafers having one or more layers of material, such as dielectric, conducting, or semi-conducting material deposited thereon. Substrates may have features such as via or contact holes, or trenches as previously described. A patterned substrate may have many features, each having different aspect ratios. FIG. 4A shows an example substrate 401 including patterned trenches or features 403.

In some embodiments, a feature may have an aspect ratio of at least about 2:1, at least about 4:1, at least about 6:1, at least about 8:1, at least about 10:1, at least about 20:1, at least about 40:1 or higher. Some features may have a depth of between about 1 μm and about 100 μm, or between about 4 μm and about 100 μm. The feature may also have a dimension near the opening, e.g., an opening diameter or line width of less than about 5000 nm, or between about 25 nm and about 5000 nm, or between about 10 nm to 500 nm, or less than about 150 nm.

Some features may be through silicon vias having feature openings between 3 μm and 5 μm and feature depths between 50 μm and 100 μm, and may have a high aspect ratio, such as at least about 20:1. in some embodiments, NAND structures may have feature openings of 150 to 500 nm and feature depths between 2 μm and 6 μm, and may have an aspect ratio of at least about 40:1.

A via, trench or other recessed feature may be referred to as an unfilled feature or a feature. According to various embodiments, the feature profile may narrow gradually and/or include an overhang at the feature opening. A re-entrant profile is one that narrows from the bottom, closed end, or interior of the feature to the feature opening. A re-entrant profile may be generated by asymmetric etching kinetics during patterning and/or the overhang due to non-conformal film step coverage in the previous film deposition, such as deposition of a diffusion barrier. In various examples, the feature may have a width smaller in the opening at the top of the feature than the width of the bottom of the feature.

During operations 304-316 of FIG. 3, an inert gas may be flowed. In various embodiments, the inert gas is used as a carrier gas. Example carrier gases include nitrogen, argon, helium, and neon. In some embodiments, the carrier gas is used as a purge gas in some operations. In some embodiments, the carrier gas is diverted. The inert gas may be provided to assist with pressure and/or temperature control of the process chamber, evaporation of a liquid reactant, more rapid delivery of the reactant and/or as a sweep gas for removing process gases from the process chamber and/or process chamber plumbing.

Disclosed embodiments may be performed at a chamber pressure between about 0.1 Torr and about 20 Torr. In many embodiments, the methods disclosed may be performed at a substrate temperature less than about 650° C., or less than about 450° C., or between about 50° C. and about 650° C., such as about 200° C. It will be understood that substrate temperature as described herein refers to the temperature at which a pedestal holding a substrate may be set. In some embodiments, the pedestal may be set to a temperature of less than about 450° C. to control the substrate temperature. In some embodiments, the method is performed at a higher temperature, such as greater than about 250° C., or greater than 450° C.

Figure 4B:
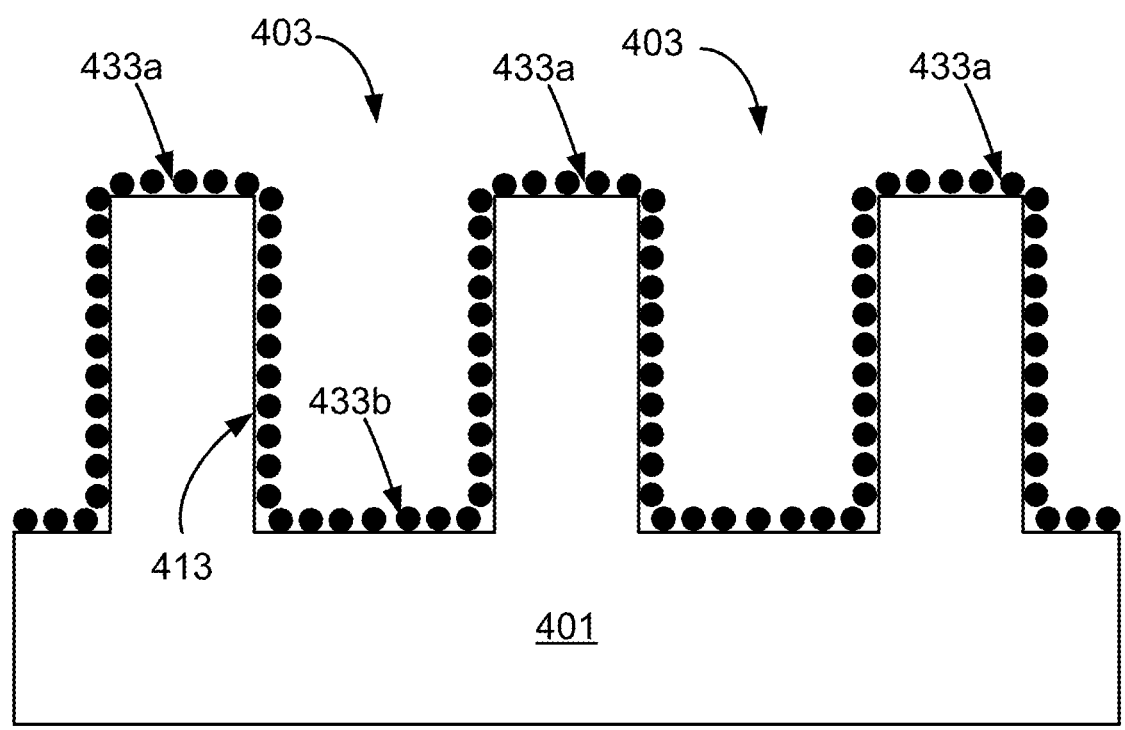

Returning to FIG. 3, in operation 304, the substrate is exposed to a deposition precursor such that the deposition precursor is adsorbed onto the substrate surface to form an adsorbed layer. FIG. 4B shows an example substrate 401 including features 403 having been exposed to a deposition precursor (shown at 433a and 433b), such that the deposition precursor molecules conformally adsorbs to the tops, sidewalls, and bottoms of the features.

The deposition precursor may be a silicon-containing precursor in some embodiments. The substrate may be exposed to the deposition precursor for a duration sufficient to saturate the surface of a substrate having features, including the bottoms and sidewalls of features. In various embodiments, the deposition precursor may fully saturate the surface of the substrate. In some embodiments, a deposition precursor adsorbs onto the substrate surface in a self-limiting manner such that once active sites are occupied by the deposition precursor, little or no additional deposition precursor will be adsorbed on the substrate surface. For example, deposition precursors may be adsorbed onto about 60% of the substrate surface. In various embodiments, when the deposition precursor is flowed to the chamber, the deposition precursor adsorbs onto active sites on the surface of the substrate, forming a thin layer of the deposition precursor on the surface. In various embodiments, this layer may be less than a monolayer, and may have a thickness between about 0.2 Å and about 0.4 Å.

A silicon-containing precursor is a single reagent or mixture of reagents used to make a silicon-containing film, where the reagent or reagent mixture contains at least one silicon compound. In some embodiments, the silicon-containing precursor may be, for example, a silane, a halosilane, or an aminosilane. Where a silicon-containing film such as silicon oxide or silicon nitride, is deposited using disclosed embodiments, various suitable silicon-containing precursors may be used.

Silicon-containing precursors suitable for use in accordance with disclosed embodiments include polysilanes ($H_3Si$—$(SiH_2)_n$—$SiH_3$), where n≥0. Examples of silanes are silane ($SiH_4$), disilane ($Si_2H_6$), and organosilanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like.

A halosilane includes at least one halogen group and may or may not include hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials when a plasma is struck, a halosilane may not be introduced to the chamber when a plasma is struck in some embodiments, so formation of a reactive halide species from a halosilane may be mitigated. Specific chlorosilanes are tetrachlorosilane, trichlorosilane, dichlorosilane, monochlorosilane, chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like.

An aminosilane includes at least one nitrogen atom bonded to a silicon atom, but may also contain hydrogens, oxygens, halogens, and carbons. Examples of aminosilanes are mono-, di-, tri- and tetra-aminosilane ($H_3Si(NH_2)_4$, $H_2Si(NH_2)_2$, $HSi(NH_2)_3$, and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$) (BTBAS), tert-butyl silylcarbamate, $SiH(CH_3)$—$(N(CH_3)_2)_2$, $SiHCl$—$(N(CH_3)_2)_2$, $Si(CH_3)_2NH_3$ and the like. A further example of an aminosilane is trisilylamine ($N(SiH_3)$).

Returning to FIG. 3, in operation 306, the process chamber is optionally purged to remove excess deposition precursor in gas phase that did not adsorb onto the surface of the substrate. Purging the chamber may involve flowing one or more purge gases or sweep gases, which may be a carrier gas used in other operations such as described above, or may be a different gas. Example purge gases include argon, nitrogen, hydrogen, and helium. In some embodiments, purging may involve evacuating the chamber. In some embodiments, operation 306 may include one or more evacuation subphases for evacuating the process chamber. Alternatively, it will be appreciated that operation 306 may be omitted in some embodiments. Operation 306 may have any suitable duration, such as between about 0 seconds and about 60 seconds, for example about 0.01 seconds. In some embodiments, increasing a flow rate of a one or more purge gases may decrease the duration of operation 306. For example, a purge gas flow rate may be adjusted according to various reactant thermodynamic characteristics and/or geometric characteristics of the process chamber and/or process chamber plumbing for modifying the duration of operation 306. In one non-limiting example, the duration of a purge phase may be adjusted by modulating purge gas flow rate. This may reduce deposition cycle time, which may improve substrate throughput. After a purge, the deposition precursors remain adsorbed onto the substrate surface.

In operation 308, the substrate is exposed to a post-dose treatment to preferentially remove adsorbed deposition precursor molecules from the top of the features. The "top" of a feature is defined as any region in the top 10% of the depth of the feature. Exposure to a post-dose treatment to preferentially remove adsorbed deposition precursor molecules results in a non-continuous, non-conformal adsorbed layer of precursor on the substrate such that after the substrate is exposed to a post-dose treatment, the bottom 90% of the depth of the feature (or bottom 80%, or bottom 70%, or bottom 60% of the depth of the feature) is at least about 90% saturated with adsorbed precursor, while little to no precursors are adsorbed at the top 10% of the features. For example, in some embodiments, the tops of the features have less than about 90% saturation, or less than about 70% saturation, or less than about 30% saturation, or less than about 10% saturation. The amount of saturation at the tops of the features can be modulated to changing process conditions of the post-dose treatment.

The post-dose treatment involves providing energy to the adsorbed layer at the top of the features to break chemical or mechanical bonds between the adsorbed precursor molecules and the underlying material (which may be semiconductor substrate material or a film deposited in prior cycles), or involves providing energy to the adsorbed layer at the top of the features to disintegrate adsorbed precursor molecules. In some embodiments, the post-dose treatment may physically sputter the adsorbed layer of precursor molecules particularly at the tops of the features to remove the precursor molecules from being adsorbed to the substrate surface. The post-dose treatment may be performed using a plasma generated from nitrogen, argon, hydrogen, ammonia, helium, and $C_xH_y$ (where x is an integer between and including 1-5 and y is an integer between and including 4-16 (e.g., x=1-5 and y=4-16)), and/or combinations thereof, with a bias between 0 W and about 1000 W. For example, in some embodiments, a bias may not be used. However, a bias may be used to control the directionality of the plasma generated during the post-dose treatment. The bias may be generated in either a powered showerhead or powered pedestal system. In some embodiments, a post-dose treatment may remove hydroxyl bonds on the surface of the substrate, such as where disclosed embodiments are used for depositing silicon oxide into features. Without being bound by a particular theory, it is believed that removal of hydroxyl bonds will prevent adsorption of the precursor during a subsequent dosing operation (such as in operation 304 in a later, repeated cycle of deposition). For example, an aminosilane precursor may bind to hydroxyl groups to adsorb onto the surface of the substrate, and a post-dose treatment may be used to remove hydroxyl bonds and prevent adsorption of the aminosilane precursor in subsequent precursor adsorption operations.

The post-dose treatment is performed at a substrate temperature between about 25° C. and about 650° C., or between about 25° C. and about 550° C. In some embodiments, where disclosed embodiments are used for depositing silicon oxide into features, the substrate temperature may be modulated to prevent formation of a nitride where a nitrogen-containing gas is used in the post-dose treatment. For example, nitrogen may not react with an adsorbed layer of a silicon-containing precursor at about 400° C. so where nitrogen is used as a post-dose treatment, the temperature may be modulated such that the post-dose treatment is performed near 400° C., or less than 400° C. to prevent nitrogen from reacting with the silicon-containing precursor to form silicon nitride. It will be understood that even if a small amount of silicon nitride is formed during the post-dose treatment, when an oxidizing plasma is used after the post-dose treatment, the oxidizing plasma will react with the silicon-containing precursor and any silicon-and-nitrogen-containing intermediate formed on the surface of the substrate to form silicon oxide.

In various embodiments, for depositing a silicon oxide film, the post-dose treatment includes exposure of the adsorbed precursor layer to an inert non-oxidizing plasma, to ultraviolet (UV) radiation, or both. Exposure to a non-oxidizing plasma may be facilitated by generating a plasma in a remote plasma generator or generating a plasma in the processing chamber where the substrate is being processed. A non-oxidizing gas is flowed to a plasma generating region, which may be the remote plasma generator or the processing chamber, and a plasma is ignited. The non-oxidizing gas may be any of nitrogen, argon, hydrogen, ammonia, helium, and $C_xH_y$ (where x=1-5, and y=4-16), and/or combinations thereof.

Process conditions including the plasma power, plasma frequency, exposure time to a non-oxidizing plasma, flow rate of the non-oxidizing gas, chamber pressure, and pedestal temperature may be modulated to prevent formation of silicon nitride if nitrogen or ammonia is used as a non-oxidizing gas for post-dose treatments in processes used to deposit silicon oxide. In some embodiments, silicon nitride may form on the surface of the substrate during a post-dose treatment, but due to the bond energies of silicon to oxygen and silicon to nitrogen, where silicon oxide is formed in subsequent operations, silicon nitride can be converted to oxide. Process conditions are modulated to avoid formation of conversion plasmas, such as an oxygen plasma for forming oxide, ammonia plasma for forming nitride, and carbon-containing plasma for forming carbide. In some embodiments, an intermediate compound may form during post-dose treatment. For example, an intermediate compound may include silicon atoms bound to nitrogen atoms from a nitrogen or ammonia post-dose treatment. Even if an intermediate compound is formed, plasma is generated at low energy such that the intermediate species converts to the desired film to be deposited when exposed to the plasma. For example, where silicon oxide is being deposited into a feature, oxygen plasma may be used after a post-dose treatment such that even if an intermediate compound is formed after post-dose treatment, the oxygen plasma will convert the intermediate compound into silicon oxide.

The plasma in operation 308 may be generated at a power at less than about 6 kW, or between about 500 W and about 4000 W. The post-dose treatment when using a gas or plasma may be performed for a duration between about 0.1 seconds and about 10 seconds, or between about 0.3 seconds and about 3 seconds.

In some embodiments, the non-oxidizing gas or post-dose treatment gas may be used without generating a plasma. A post-dose treatment performed using ultraviolet radiation may be performed by exposing the substrate to UV light having a wavelength between about 10 nm and about 400 nm. The substrate may be exposed to ultraviolet radiation for a duration between about 0.1 seconds and about 10 seconds. The duration and wavelength of UV light used depends on the precursor used and the aspect ratio of the features on the substrate.

Figure 4C:
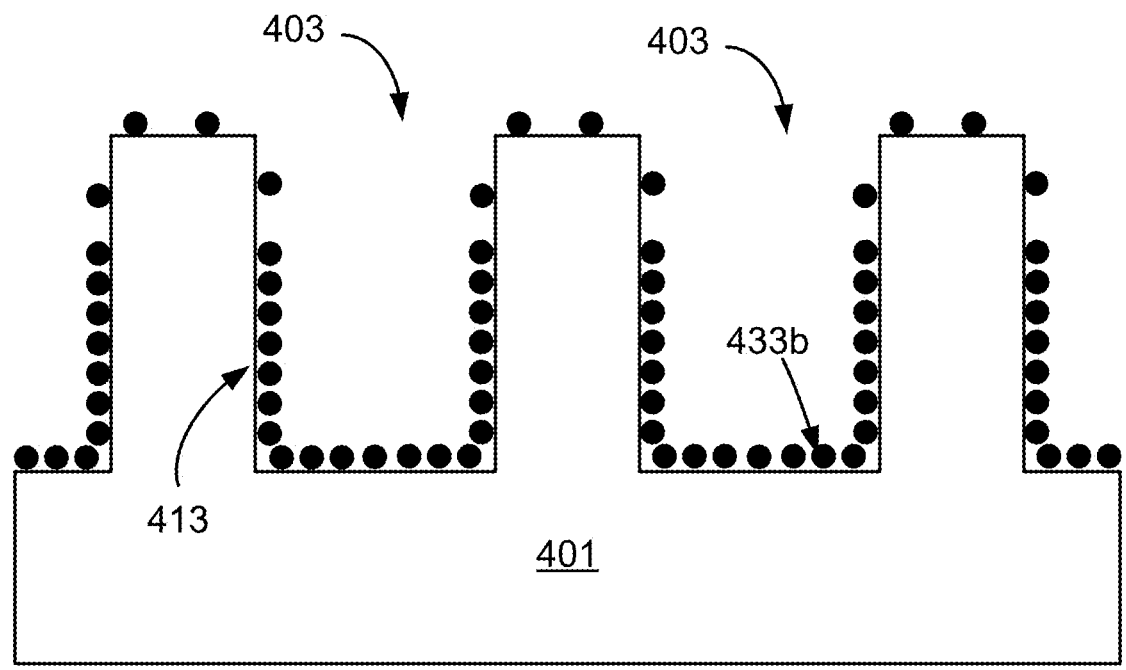

FIG. 4C shows an example substrate 401 having features 403 where some of the adsorbed precursor molecules at the top of the features 403 are removed, while the adsorbed precursor on the bottoms and sidewalls 413 of the features 403 remain adsorbed to the substrate.

Returning to FIG. 3, in operation 310, the process chamber is optionally purged to remove the removed adsorbed precursor molecules from the post-dose treatment process. Purging may involve any of the processes and process conditions described above with respect to operation 306.

In operation 312, the substrate is exposed to a reactant and a plasma is ignited such that the adsorbed silicon-containing precursor layer remaining on the surface of the substrate is converted to the desired film, such as silicon oxide. Note that the term "reactant" or "second reactant" may be used to describe one or more gases introduced to the chamber when plasma is ignited in a deposition cycle. In various embodiments, the second reactant is an oxygen-containing reactant or oxidant, to form at least a partial silicon oxide film on the surface of the substrate. This operation may be performed for a duration between about 0.05 seconds and about 10 seconds. The duration of this operation may be modulated depending on the depth of the trench or feature where material is being deposited, and depending on the number of cycles used as further described below with respect to operation 316.

In various embodiments, during operation 312, plasma energy is provided to activate the second reactant, such as an oxygen-containing gas, into ions, radicals, neutral species, and other activated species, which react with the remaining adsorbed layer of the silicon-containing deposition precursor. For example, the plasma may directly or indirectly activate the oxygen-containing gas phase molecules to form oxygen radicals or ions. Conditions of the chamber may be monitored such that sufficient plasma species can diffuse into trenches and tailor the feature profile and improve conformality within features and trenches.

In various embodiments, the plasma is an in-situ plasma, such that the plasma is formed directly above the substrate surface in the chamber. The in-situ plasma may be ignited at a power per substrate area between about 0.2122 W/cm$^2$ and about 2.122 W/cm$^2$. For example, the power may range from about 150 W to about 6000 W, or from about 600 W to about 6000 W, or from about 800 W to about 4000 W, for a chamber processing four 300 mm wafers. For example, plasmas for ALD processes may be generated by applying a radio frequency (RF) field to a gas using two capacitively coupled plates. Ionization of the gas between plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. In various embodiments, a high frequency plasma is used having a frequency of at least about 13.56 MHz, or at least about 27 MHz, or at least about 40 MHz, or at least about 60 MHz. In some embodiments, a microwave-based plasma may be used. Non-limiting examples of electrodes include process gas distribution showerheads and substrate support pedestals. It will be appreciated that plasmas for ALD processes may be formed by one or more suitable methods other than capacitive coupling of an RF field to a gas. In some embodiments, the plasma is a remote plasma, such that a second reactant is ignited in a remote plasma generator upstream of the chamber, then delivered to the chamber where the substrate is housed.

Example oxygen-containing reactants or oxidants include a mixture of oxygen and a weak oxidizer such as nitrous oxide, carbon monoxide, carbon dioxide, nitric oxide, nitrogen dioxide, sulfur oxide, sulfur dioxide, oxygen-containing hydrocarbons (e.g., $C_xH_yO_z$) and/or water. In other implementations, the oxidation reactant may be entirely weak oxidizer. Alternatively, the oxidation reactant may include ozone.

For deposition of other silicon-containing materials, other reactants may be used as the second reactant to deposit films of different materials. For example, for deposition of a silicon carbide film using disclosed embodiments, the second reactant may be a carbon-containing reactant. For example, for deposition of silicon nitride, a nitrogen-containing reactant may be used. A nitrogen-containing reactant is a reactant or mixture of reactants that includes at least one nitrogen, for example, ammonia, hydrazine, amines (amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary, or quaternary (for example, tetraalkylammonium compounds). A nitrogen-containing reactant can contain heteroatoms other than nitrogen, for example, hydroxylamine, t-butyloxycarbonyl amine, and N-t-butyl hydroxylamine are nitrogen-containing reactants. Example nitrogen-containing reactants include nitrogen gas, ammonia, and amines. For deposition a doped film, a dopant may also be added as a second reactant.

Figure 4D:
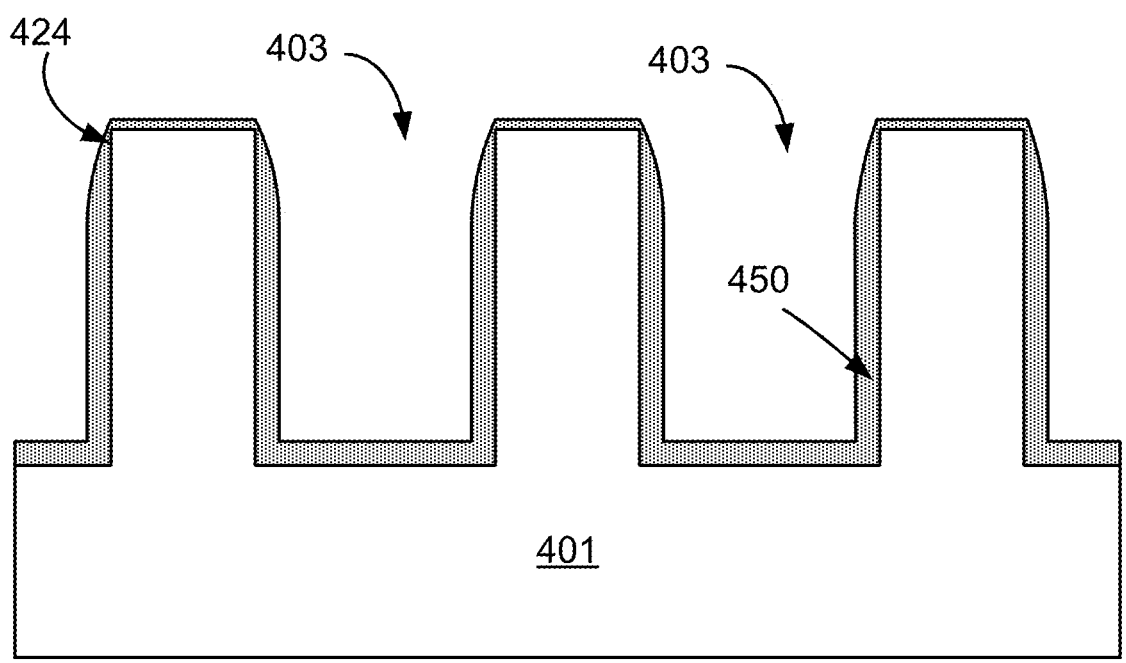

FIG. 4D shows an example substrate 401 with trenches or features 403 whereby the substrate has been exposed a second reactant with a plasma and the adsorbed layer of precursor molecules has been reacted and converted to form a film 450 on the substrate, where the film 450 is preferentially deposited along the sidewalls and the bottom of the trenches, while little to no deposition of the film is formed over the top 424 of the features 403. In various embodiments, the thickness of the deposited silicon-containing film is less than the thickness of the deposited silicon-containing film at the bottoms of the features.

Returning to FIG. 3, in operation 314, the process chamber is optionally purged to remove any residual byproducts. Purging may involve any of the processes and process conditions described above with respect to operation 306.

In operation 316 of FIG. 3, it is determined whether the desired thickness of film has been deposited. If not, operations 304-314 are repeated in sufficient cycles to deposit a desired thickness of film. Any suitable number of deposition cycles may be included in a process to deposit a desired film thickness of the desired film in accordance with certain disclosed embodiments. In various embodiments, operations may be repeated for n cycles, where n is an integer greater than or equal to 2. For example, in some embodiments, operations 304-314 may be repeated for two or more cycles.

The frequency of performing the post-dose treatment of operation 308 to preferentially remove adsorbed precursor at the top of the features may depend on the size of the features and the amount of film to be deposited in the features. As noted above, exposure to a post-dose treatment may not necessarily be performed in every cycle. In later, repeated cycles, as the trench depth decreases (e.g., as the trench is filled with material such as silicon oxide), the frequency of performing a post-dose treatment may be modified or reduced. For example, as the trench fills with silicon oxide, the aspect ratio of the remaining feature to be filled with silicon oxide decreases and the post-dose treatment may not need to be performed to avoid formation of a void.

The duration of operation 312 may depend on the size of the feature or trench to be filled and may be reduced in later repeated deposition cycles. For example, in some embodiments, the initial cycles of performing disclosed embodiments may use a longer duration of operation 312 (such as between about 0.1 seconds and about 10 seconds) to allow diffusion of the second reactant plasma into trenches and features to reach with adsorbed precursor at the bottom and sidewalls of trenches and features. In later cycles where the trenches and features are at least about 30% filled, the duration of operation 312 may be gradually reduced as the distance the second reactant plasma travels to diffuse to the adsorbed layer of precursor molecules decreases. In some later cycles where the trenches and features are at least about 80% filled, the post-dose treatment operation may not be performed in every cycle, or in any cycle.

Figure 5:
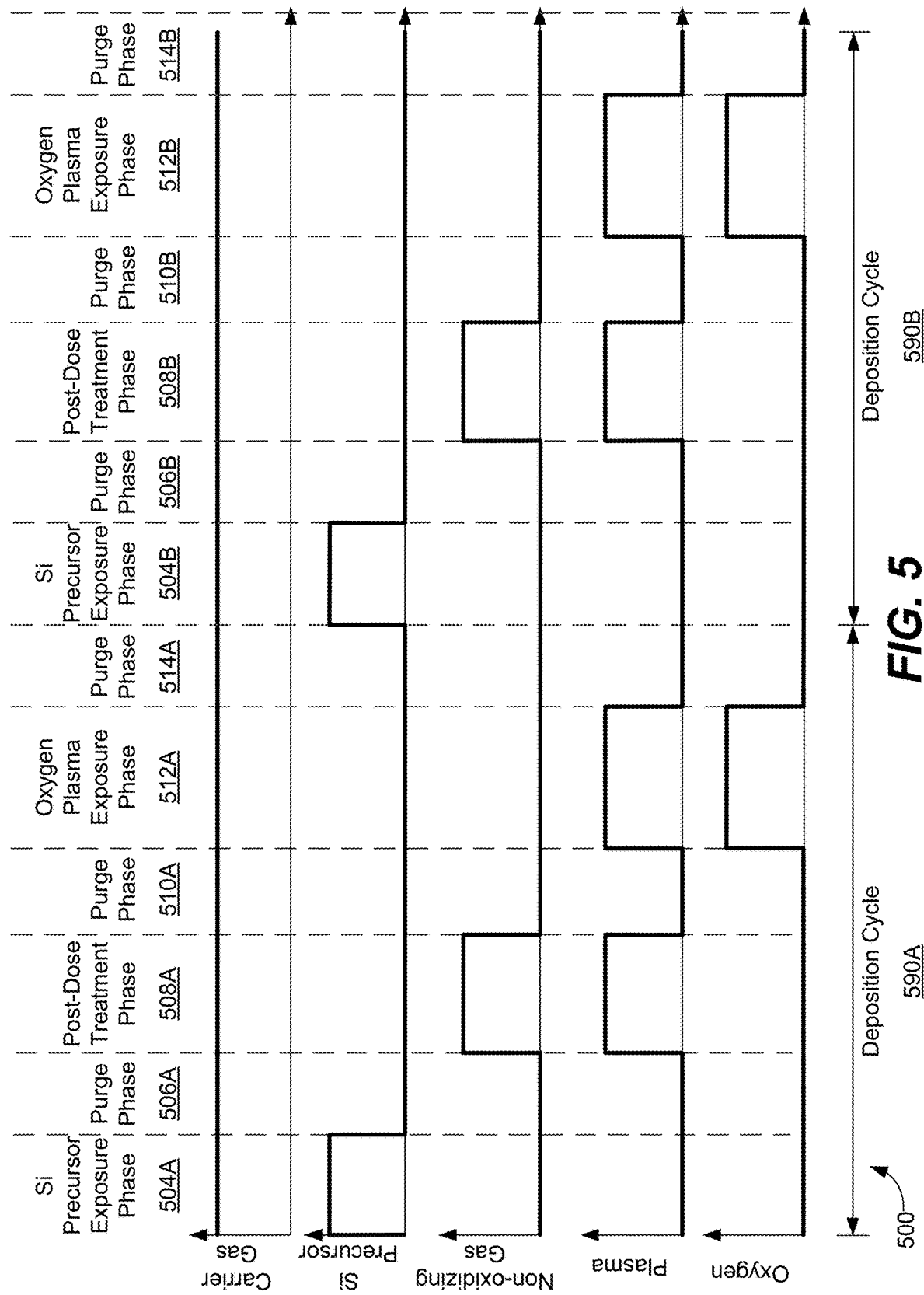
FIG. 5 is a timing sequence diagram showing an example of cycles in a method in accordance with certain disclosed embodiments.

FIG. 5 is a timing sequence diagram of example pulses in accordance with certain disclosed embodiments. FIG. 5 shows phases in an example ALD process 500 for various process parameters, such as carrier gas flow, first precursor flow, post-dose treatment gas flow, plasma, and second reactant flow. The lines indicate when the flow or plasma is turned on and off, accordingly. Additional example process parameters include, but are not limited to, flow rates for inert and reactant species, plasma power and frequency, substrate temperature, and process chamber pressure. The example provided in FIG. 5 depicts two deposition cycles 590A and 590B for depositing a silicon oxide film using a silicon-containing precursor and oxygen plasma, and a non-oxidizing plasma is used for post-dose treatment.

Two deposition cycles 590A and 590B are depicted. Each deposition cycle includes various phases. For example, deposition cycle 590A includes a silicon precursor exposure phase 504A, which may correspond to operation 304 of FIG. 3; a purge phase 506A (which may be optional and may correspond to operation 306 of FIG. 3); a post-dose treatment phase 508A, which may correspond to operation 308 of FIG. 3; a purge phase 510A (which may be optional and may correspond to operation 310 of FIG. 3); an oxygen plasma exposure phase 512A, which may correspond to combining operation 312 in FIG. 3; and purge phase 514A which may correspond to operation 314 of FIG. 3. As shown in example process 500, a carrier gas is flowed throughout the process. It will be understood that any suitable carrier gas may be used as describe elsewhere herein. In various embodiments, the carrier gas is used as a purge gas. In process 500, the carrier gas is depicted as being both a carrier gas and a purge gas during pure phases 506A, 510A, 514A, 506B, 510B, and 514B. In some embodiments, the carrier gas may be different than the purge gas. In some embodiments, a carrier gas is only flowed during one or more of the purge phases (506A, 510A, 514A, 506B, 510B, and 514B). A carrier gas may be any of those described above with respect to operation 306 of FIG. 3.

In silicon precursor exposure phase 504A, which may correspond to operation 304 of FIG. 3, a silicon-containing precursor is flowed with a carrier gas and oxygen flow is turned off. The plasma is also turned off, and non-oxidizing gas flow is also turned off. In purge phase 506A, all gas flows except the carrier gas are turned off and the plasma is turned off. This may correspond to operation 306 of FIG. 3. In post-dose treatment phase 508A, the carrier gas remains on, the non-oxidizing gas flow is turned on, and the plasma is turned on to generate a non-oxidizing plasma to preferentially remove adsorbed silicon-containing precursor molecules at or near the top of features. The silicon-containing precursor and oxygen gas flows are turned off. This may correspond to operation 308 of FIG. 3. In purge phase 510A, all gas flows except the carrier gas are turned off and the plasma is turned off. This may correspond to operation 310 of FIG. 3. In oxygen plasma exposure phase 512A, the carrier gas is flowed with the oxygen flow, while the plasma is turned on to ignite and generate and oxygen-containing plasma. This oxygen-containing plasma reacts with the remaining adsorbed precursor to selectively form silicon oxide along sidewalls and the bottom of trenches while forming little to no silicon oxide at or near the tops of the trenches. This operation may correspond to combining operations 312 of FIG. 3. In purge phase 514A, the carrier gas flow remains on and all other gas flows and plasma is turned off.

In example process 500, it is determined in operation 316 of FIG. 3 that the film deposited is not an adequate thickness or the desired thickness, so the deposition cycle is repeated in deposition cycle 590B. In this example, deposition cycle 590B includes silicon-containing exposure phase 504B, purge phase 506B (which may be optional), post-dose treatment phase 508B, purge phase 510B (which may be optional), oxygen plasma exposure phase 512B, and purge phase 514B (which may be optional).

Apparatus

Figure 6:
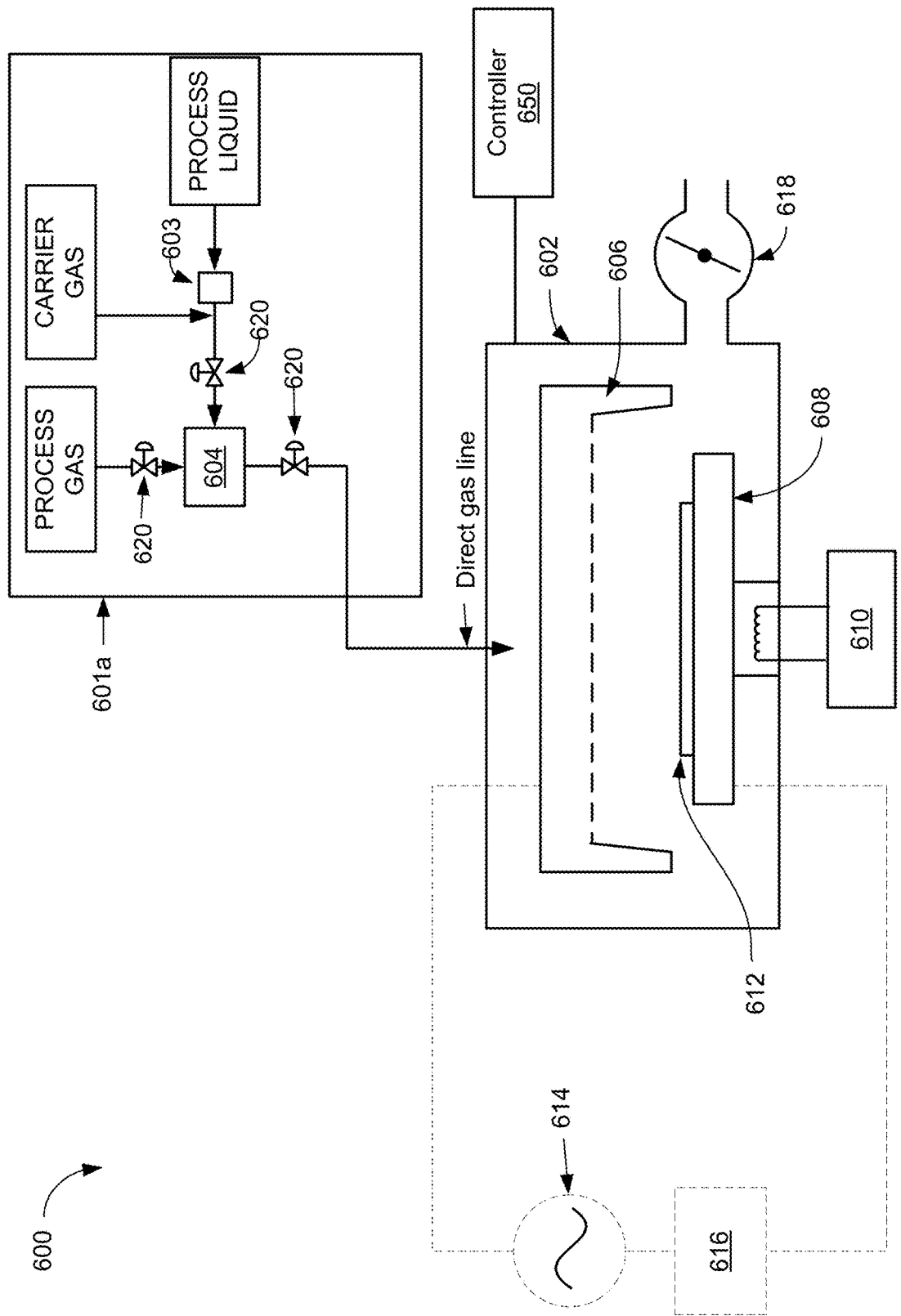
FIG. 6 is a schematic diagram of an example process chamber for performing certain disclosed embodiments.
Figure 7:
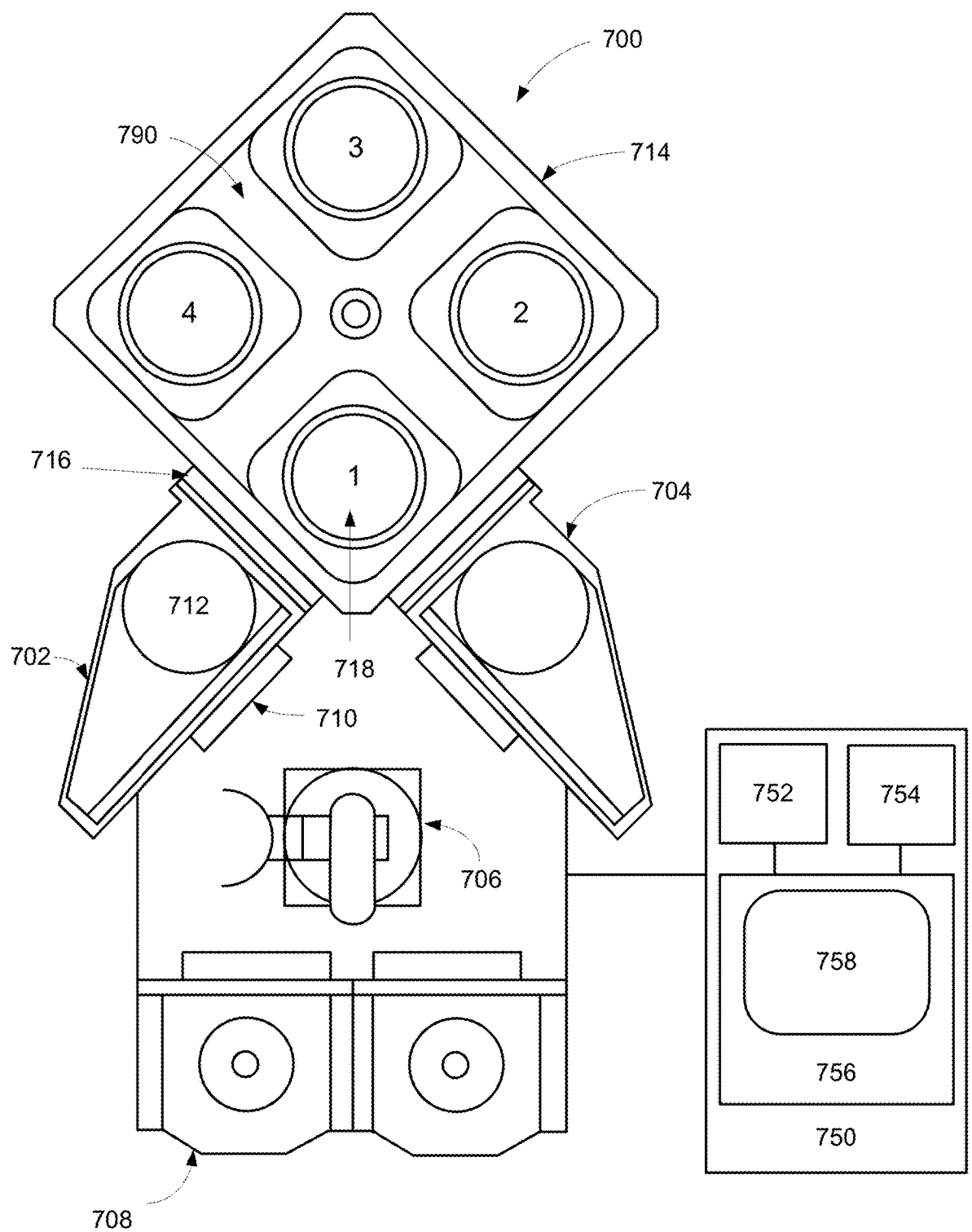
FIG. 7 is a schematic diagram of an example process tool for performing certain disclosed embodiments.

FIG. 6 depicts a schematic illustration of an embodiment of an atomic layer deposition (ALD) process station 600 having a process chamber 602 for maintaining a low-pressure environment. A plurality of ALD process stations may be included in a common low pressure process tool environment. For example, FIG. 7 depicts an embodiment of a multi-station processing tool 700. In some embodiments, one or more hardware parameters of ALD process station 600, including those discussed in detail below, may be adjusted programmatically by one or more computer controllers 650.

ALD process station 600 fluidly communicates with reactant delivery system 601a for delivering process gases to a distribution showerhead 606. Reactant delivery system 601a includes a mixing vessel 604 for blending and/or conditioning process gases, such as a silicon-containing gas, or oxygen-containing gas, or post-dose treatment gases such as non-oxidizing gases, for delivery to showerhead 606. One or more mixing vessel inlet valves 620 may control introduction of process gases to mixing vessel 604. The mixing vessel 604 may also be used for blending post-dose treatment gases such as argon, hydrogen, nitrogen, ammonia, $C_xH_y$ (where x=1-5, and y=4-16), and/or combinations thereof. In various embodiments, the post-dose treatment is performed in process station 600 and the film deposition is also performed in the same process station 600. For example, in some embodiments, the ALD process station 600 may be used to deliver a deposition precursor gas to the process chamber 602, then deliver a non-oxidizing gas and ignite a plasma to preferentially remove adsorbed precursor on a substrate, then deliver a second reactant and ignite a plasma to convert remaining adsorbed precursors on the substrate to a film such as silicon oxide. In some embodiments, the post-dose treatment is performed in a process station separate from the ALD process station 600, such as in another station of the multi-station processing tool 700 as further described below with respect to FIG. 7.

As an example, the embodiment of FIG. 6 includes a vaporization point 603 for vaporizing liquid reactant to be supplied to the mixing vessel 604. In some embodiments, vaporization point 603 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 603 may be heat traced. In some examples, mixing vessel 604 may also be heat traced. In one non-limiting example, piping downstream of vaporization point 603 has an increasing temperature profile extending from approximately 100° C. to approximately 150° C. at mixing vessel 604.

In some embodiments, a liquid precursor or liquid reactant may be vaporized at a liquid injector (not shown). For example, a liquid injector may inject pulses of a liquid reactant into a carrier gas stream upstream of the mixing vessel 604. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 603. In one scenario, a liquid injector may be mounted directly to mixing vessel 604. In another scenario, a liquid injector may be mounted directly to showerhead 606.

In some embodiments, a liquid flow controller (LFC) upstream of vaporization point 603 may be provided for controlling a mass flow of liquid for vaporization and delivery to process chamber 602. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 606 distributes process gases toward substrate 612. In the embodiment shown in FIG. 6, the substrate 612 is located beneath showerhead 606 and is shown resting on a pedestal 608. Showerhead 606 may have any suitable shape, and may have any suitable number and arrangement of ports for distributing process gases to substrate 612.

In some embodiments, pedestal 608 may be raised or lowered to expose substrate 612 to a volume between the substrate 612 and the showerhead 606. In some embodiments, pedestal 608 may be temperature controlled via heater 610. Pedestal 608 may be set to any suitable temperature, such as between about 25° C. and about 650° C. during operations for performing various disclosed embodiments. It will be appreciated that, in some embodiments, pedestal height may be adjusted programmatically by a suitable computer controller 650.

In another scenario, adjusting a height of pedestal 608 may allow a plasma density to be varied during plasma activation cycles and post-dose treatment operations performed in certain disclosed embodiments. At the conclusion of a process phase, pedestal 608 may be lowered during another substrate transfer phase to allow removal of substrate 612 from pedestal 608.

In some embodiments, a position of showerhead 606 may be adjusted relative to pedestal 608 to vary a volume between the substrate 612 and the showerhead 606. Further, it will be appreciated that a vertical position of pedestal 608 and/or showerhead 606 may be varied by any suitable mechanism within the scope of the present disclosure. In some embodiments, pedestal 608 may include a rotational axis for rotating an orientation of substrate 612. It will be appreciated that, in some embodiments, one or more of these example adjustments may be performed programmatically by one or more suitable computer controllers 650. The computer controller 650 may include any of the features described below with respect to controller 750 of FIG. 7.

In some embodiments where plasma may be used as discussed above, showerhead 606 and pedestal 608 electrically communicate with a radio frequency (RF) power supply 614 and matching network 616 for powering a plasma. In some embodiments, the plasma energy may be controlled by controlling one or more of a process station pressure, a gas concentration, an RF source power, an RF source frequency, and a plasma power pulse timing. For example, RF power supply 614 and matching network 616 may be operated at any suitable power to form a plasma having a desired composition of radical species. Examples of suitable powers are included above. Likewise, RF power supply 614 may provide RF power of any suitable frequency. In some embodiments, RF power supply 614 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions. The plasma conditions may be controlled and/or maintained such that plasma generated for a post-dose treatment operation preferentially removes adsorbed precursor molecules at or near feature openings rather than in sidewalls or at the bottom of features. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 650 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor such as a silicon-containing precursor), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for modulating a flow rate of a post-dose treatment gas such as nitrogen when the process is programmed to deposit silicon oxide, instructions for modulating the flow rate of a carrier or purge gas, instructions for igniting a plasma, and time delay instructions for the third recipe phase. A fourth, subsequent recipe phase may include instructions for modulating or stopping a flow rate of an inert and/or a post-dose treatment gas, and instructions for modulating a flow rate of a carrier or purge gas and time delay instructions for the fourth recipe phase. A fifth recipe phase may include instructions for modulating a flow rate of a second reactant gas such as oxygen, instructions for modulating the flow rate of a carrier or purge gas, instructions for igniting a plasma, and time delay instructions for the fifth recipe phase. A sixth, subsequent recipe phase may include instructions for modulating or stopping a flow rate of an inert and/or a reactant gas, and instructions for modulating a flow rate of a carrier or purge gas and time delay instructions for the sixth recipe phase. It will be appreciated that these recipe phases may be further subdivided and/or iterated in any suitable way within the scope of the present disclosure.

Further, in some embodiments, pressure control for process station 600 may be provided by butterfly valve 618. As shown in the embodiment of FIG. 6, butterfly valve 618 throttles a vacuum provided by a downstream vacuum pump (not shown). However, in some embodiments, pressure control of process station 600 may also be adjusted by varying a flow rate of one or more gases introduced to the process station 600.

As described above, one or more process stations may be included in a multi-station processing tool. FIG. 7 shows a schematic view of an embodiment of a multi-station processing tool 700 with an inbound load lock 702 and an outbound load lock 704, either or both of which may include a remote plasma source (not shown). A robot 706, at atmospheric pressure, is configured to move wafers from a cassette loaded through a pod 708 into inbound load lock 702 via an atmospheric port 710. A wafer (not shown) is placed by the robot 706 on a pedestal 712 in the inbound load lock 702, the atmospheric port 710 is closed, and the load lock inbound 702 is pumped down. Where the inbound load lock 702 includes a remote plasma source, the wafer may be exposed to a remote plasma treatment in the inbound load lock 702 prior to being introduced into a processing chamber 714. Further, the wafer also may be heated in the inbound load lock 702 as well, for example, to remove moisture and adsorbed gases. Next, a chamber transport port 716 to processing chamber 714 is opened, and another robot (not shown) places the wafer into the reactor on a pedestal of a first station shown in the reactor for processing. While the embodiment depicted in FIG. 7 includes load locks, it will be appreciated that, in some embodiments, direct entry of a wafer into a process station may be provided.

The depicted processing chamber 714 includes four process stations, numbered from 1 to 4 in the embodiment shown in FIG. 7. Each station has a heated pedestal (shown at 718 for station 1), and gas line inlets. It will be appreciated that in some embodiments, each process station may have different or multiple purposes. For example, in some embodiments, a process station may be switchable between an ALD and plasma-enhanced ALD process mode. In another example, post-dose treatment operations may be performed in one station, while exposure to a deposition precursor and exposure to a second reactant and plasma may be performed in another station. In some embodiments, exposure to a deposition precursor, post-dose treatment, and exposure to a second reactant and plasma are performed in the same station. Additionally or alternatively, in some embodiments, processing chamber 714 may include one or more matched pairs of ALD and plasma-enhanced ALD process stations. While the depicted processing chamber 714 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 7 depicts an embodiment of a wafer handling system 790 for transferring wafers within processing chamber 714. In some embodiments, wafer handling system 790 may transfer wafers between various process stations and/or between a process station and a load lock. It will be appreciated that any suitable wafer handling system may be employed. Non-limiting examples include wafer carousels and wafer handling robots. FIG. 7 also depicts an embodiment of a system controller 750 employed to control process conditions and hardware states of process tool 700. System controller 750 may include one or more memory devices 756, one or more mass storage devices 754, and one or more processors 752. Processor 752 may include a CPU or computer, analog, and/or digital input/output connections, stepper motor controller boards, etc.

In some embodiments, system controller 750 controls all of the activities of process tool 700. System controller 750 executes system control software 758 stored in mass storage device 754, loaded into memory device 756, and executed on processor 752. Alternatively, the control logic may be hard coded in the controller 750. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 758 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 700. System control software 758 may be configured in any suitable way. For example, various process tool component subroutines or control objects may be written to control operation of the process tool components used to carry out various process tool processes. System control software 758 may be coded in any suitable computer readable programming language.

In some embodiments, system control software 758 may include input/output control (IOC) sequencing instructions for controlling the various parameters described above. Other computer software and/or programs stored on mass storage device 754 and/or memory device 756 associated with system controller 750 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 718 and to control the spacing between the substrate and other parts of process tool 700.

A process gas control program may include code for controlling gas composition (e.g., silicon-containing gases, oxygen-containing gases, gases for performing a post-dose treatment, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 750. The user interface may include a display screen, graphical software displays of the apparatus and/or process conditions, and user input devices such as pointing devices, keyboards, touch screens, microphones, etc.

In some embodiments, parameters adjusted by system controller 750 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 750 from various process tool sensors. The signals for controlling the process may be output on the analog and digital output connections of process tool 700. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 750 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 750 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 750.

In some implementations, the system controller 750 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 750, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 750 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 750 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 750, in some implementations, may be a part of or coupled to a computer that is integrated with, coupled to the system, otherwise networked to the system, or a combination thereof. For example, the system controller 750 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 750 receives instructions in the form of data, which specify parameters for each of the processing steps to be performed during one or more operations. It should be understood that the parameters may be specific to the type of process to be performed and the type of tool that the system controller 750 is configured to interface with or control. Thus as described above, the system controller 750 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 750 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

A silicon oxide film was deposited on a substrate exposed to cycles of the following operations: exposure to a silicon-containing precursor, purging using argon, exposure to nitrogen plasma as a non-oxidizing plasma used for post-dose treatment, purging using argon, exposure to oxygen plasma, and purging using argon.

The deposition was performed at a pedestal temperature of 50° C. The nitrogen plasma post-dose treatment was performed at varying plasma powers as shown in Table 1 below and with various exposure times, where the exposure time is the duration of exposure to a single post-dose treatment in one cycle of PEALD. The oxygen plasma used to convert the silicon-containing precursor adsorbed onto the substrate to silicon oxide was generated at a power of 500 W, with each exposure to oxygen plasma lasting 0.3 seconds within each cycle. The deposition rate of silicon oxide per cycle was evaluated and is shown in Table 1.

TABLE 1

| Deposition Rates | | |
|---|---|---|
| Post Dose Plasma ($N_2$) | | |
| RF Power (W) | RF Time (s) | Deposition Rate (Å/cyc) |
| 0 | 0.0 | 1.451 |
| 500 | 0.3 | 1.261 |
| 1000 | 0.3 | 1.243 |
| 4000 | 0.3 | 1.151 |
| 4000 | 1.0 | 1.134 |
| 4000 | 3.0 | 0.962 |

A reduction in deposition rate was observed as plasma power and time increased, suggesting that silicon was removed after adsorption and/or some densification of the deposited film was occurring.

Experiment 2

A silicon oxide film was deposited on a substrate exposed to cycles of the following operations: exposure to a silicon-containing precursor, purging using argon, exposure to nitrogen plasma as a non-oxidizing plasma used for post-dose treatment, purging using argon, exposure to oxygen plasma, and purging using argon.

A second silicon oxide film was deposited on a substrate was exposed to cycles of the following operations: exposure to a silicon-containing precursor, purging using argon, exposure to argon plasma as a non-oxidizing plasma used for post-dose treatment, purging using argon, exposure to oxygen plasma, and purging using argon.

The depositions were performed at a pedestal temperature of 400° C. The plasma post-dose treatments were performed at varying plasma powers as shown in Table 2 below and with various exposure times, where the exposure time is the duration of exposure to a single post-dose treatment in one cycle of PEALD. The oxygen plasma used to convert the silicon-containing precursor adsorbed onto the substrate to silicon oxide was generated at a power of 4000 W, with each exposure to oxygen plasma lasting 0.25 seconds within each cycle.

The deposition rates of silicon oxide per cycle using nitrogen plasma and using argon plasma as post-dose treatments were evaluated and are shown in Table 2.

TABLE 2

Nitrogen and Argon Plasma Post-Dose Treatments

| Post Dose Plasma | | Deposition | Deposition |
|---|---|---|---|
| RF Power (W) | RF Time (s) | Rate (Å/cyc) $N_2$ | Rate (Å/cyc) Ar |
| 0 | 0 | 0.843 | 0.839 |
| 500 | 0.3 | 0.837 | 0.836 |
| 1000 | 0.3 | 0.832 | 0.832 |
| 1000 | 1 | 0.824 | |
| 4000 | 0.25 | 0.783 | |
| 4000 | 1 | 0.773 | |
| 4000 | 3 | 0.758 | |

Like Experiment 1, a reduction in deposition rate was observed as plasma power and time increased, suggesting that silicon was removed after adsorption and/or some densification of the deposited film was occurring in both processes. As compared to Experiment 1, which was conducted at a lower temperature, the deposition rates in Experiment 2 were less than that of Experiment 1.

Experiment 3

A silicon oxide film was deposited on a substrate using cycles of the following operations: exposure to a silicon-containing precursor, purging using argon, exposure to oxygen plasma, and purging using argon. This film was not deposited using a post-dose treatment.

Three substrates were exposed to cycles of the following operations: exposure to a silicon-containing precursor, purging using argon, exposure to nitrogen/oxygen plasma as a non-oxidizing plasma used for post-dose treatment, purging using argon, exposure to oxygen plasma, and purging using argon.

The depositions were performed at varying pedestal temperatures. The plasma post-dose treatments were performed at 4000 W as shown in Table 3 below and with various exposure times, where the exposure time is the duration of exposure to a single post-dose treatment in one cycle of PEALD. The oxygen plasma used to convert the silicon-containing precursor adsorbed onto the substrate to silicon oxide was generated at a power of 2000 W, with each exposure to oxygen plasma lasting 0.3 seconds within each cycle for two trials, and lasting 0.6 seconds within each cycle for another two trials.

The deposition rates of silicon oxide per cycle using nitrogen plasma as post-dose treatments and varying deposition temperatures were evaluated and are shown in Table 3.

TABLE 3

Post-Dose Treatment Times and Pedestal Temperature

| Post Dose Plasma | | | Deposition Rate (Å/cycle) | | | |
|---|---|---|---|---|---|---|
| Plasma | RF Power (W) | RF Time (s) | 300° C. | 200° C. | 100° C. | 50° C. |
| | 0 | 0 | 0.698 | 0.908 | 1.223 | 1.395 |
| $O_2$ Plasma | 4000 | 0.3 | 0.675 | 0.871 | 1.168 | 1.344 |
| $N_2$ Plasma | 4000 | 0.3 | 0.600 | 0.752 | 1.006 | 1.152 |
| $N_2$ Plasma | 4000 | 3.0 | 0.538 | 0.651 | 0.832 | 0.938 |

Like Experiment 1, a reduction in deposition rate was observed as plasma power and time increased, suggesting that silicon was removed after adsorption and/or some densification of the deposited film was occurring in both processes. As compared to Experiment 1, which was conducted at a lower temperature, the reduction in deposition rate is less than the reduction observed in Experiment 1. These results suggest that areas of the substrate exposed to the post-dose treatment, such as tops of high aspect ratio features, would result in a reduction in deposition rate, thereby preventing features from closing and forming a void. Such results suggest that post-dose treatments may be favorably used to provide bottom-up growth of material in features.

A comparison of the second and third rows of Table 3, where the process conditions were the same except for the gas species used during the post-dose treatment, shows that a non-oxidizing plasma removes adsorbed precursor because the deposition rate using $N_2$ plasma was much lower than with $O_2$ plasma.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. An apparatus for processing substrates, the apparatus comprising:
   (a) at least one process chamber including a pedestal for holding a substrate having one or more features;
   (b) at least one outlet for coupling the at least one process chamber to a vacuum;
   (c) one or more process gas inlets coupled to one or more silicon-containing precursor sources, one or more post-dose treatment gas sources, and one or more reactant gas sources;
   (d) a radio-frequency (RF) generator; and
   (e) a controller for controlling operations in the apparatus, wherein the controller is configured with machine-readable instructions for performing the following operations:
      (i) introducing a silicon-containing precursor from at least one of the one or more silicon-containing precursor sources to the at least one process chamber under conditions allowing the silicon-containing precursor to adsorb onto the surface of the substrate, thereby forming an adsorbed layer of the silicon-containing precursor over the substrate;

(ii) prior to introducing a reactant from at least one of the one or more reactant gas sources to the at least one process chamber and after introducing the silicon-containing precursor, removing the adsorbed layer of the silicon-containing precursor under plasma conditions that remove the adsorbed layer preferentially at tops than at bottoms of the one or more features of the substrate by exposing the substrate during a post-dose treatment operation, wherein the post-dose treatment operation includes exposing the substrate to a first plasma generated from a gas selected from the group consisting of: nitrogen, argon, hydrogen, ammonia, helium, and $C_xH_y$, wherein x is an integer between and including 1-5 and y is an integer between and including 4-16, and (iii) introducing the reactant and igniting a second plasma to form a silicon-containing film over the substrate.

2. The apparatus of claim 1, wherein the controller configured with machine-readable instructions for removing the adsorbed layer of the silicon-containing precursor preferentially at the tops than at the bottoms of the one or more features is further configured with machine-readable instructions for igniting the first plasma at a plasma power less than about 6 kW.

3. The apparatus of claim 2, wherein the controller configured with machine-readable instructions for removing the adsorbed layer of the silicon-containing precursor at the tops of the one or more features is further configured with machine-readable instructions for applying a bias at a bias power between 0 W and 1000 W.

4. The apparatus of claim 1, wherein the thickness of the silicon-containing film at the tops of the one or more features is less than the thickness of the silicon-containing film at bottoms of the one or more features.

5. The apparatus of claim 1, wherein the controller configured with machine-readable instructions for removing the adsorbed layer of the silicon-containing precursor is configured with machine-readable instructions for exposing the substrate to ultraviolet radiation at a wavelength between about 10 nm and about 400 nm.

6. The apparatus of claim 1, wherein the post-dose treatment operation is performed for a duration between about 0.1 seconds and about 10 seconds.

7. The apparatus of claim 1, wherein the post-dose treatment operation is performed at a pedestal temperature between about 25° C. and about 650° C.

8. The apparatus of claim 1, wherein the silicon-containing film is selected from the group consisting of silicon oxide, silicon nitride, and silicon carbide.

9. The apparatus of claim 1, wherein the one or more features have an aspect ratio of at least about 2:1.

10. The apparatus of claim 1, wherein at least one of the one or more features has a feature opening that is less than about 5000 nm wide.

11. The apparatus of claim 1, wherein the controller is further configured with machine-readable instructions for repeating operations (i)-(iii) for n cycles, where n is an integer greater than 2.

12. The apparatus of claim 1, wherein the controller is further configured with machine-readable instructions for purging the at least one process chamber in between operations (i) and (ii).

13. The apparatus of claim 1, wherein the controller is further configured with machine-readable instructions for purging the at least one process chamber in between operations (ii) and (iii).

* * * * *